United States Patent [19]
Jerominek et al.

[11] Patent Number: 5,831,266
[45] Date of Patent: Nov. 3, 1998

[54] MICROBRIDGE STRUCTURE FOR EMITTING OR DETECTING RADIATIONS AND METHOD FOR FORMING SUCH MICROBRIDGE STRUCTURE

[75] Inventors: Hubert Jerominek, Ste-Foy; Martin Renaud, Québec; Nicholas R. Swart, Ancienne-Lorette, all of Canada

[73] Assignee: Institut National d'Optique, Sainte-Foy, Canada

[21] Appl. No.: 713,147

[22] Filed: Sep. 12, 1996

[51] Int. Cl.⁶ .................................................. G01J 5/20
[52] U.S. Cl. ................................. 250/338.4; 250/338.1
[58] Field of Search ........................... 250/338.4, 338.1, 250/370.01, 338.2; 257/684

[56] References Cited

U.S. PATENT DOCUMENTS

| | | | |
|---|---|---|---|
| 3,991,460 | 11/1976 | Roberts | 29/578 |
| 4,574,263 | 3/1986 | Liddiard . | |
| 4,894,701 | 1/1990 | Erhardt et al. . | |
| 4,967,081 | 10/1990 | Quad et al. . | |
| 5,010,251 | 4/1991 | Grinberg et al. . | |
| 5,017,786 | 5/1991 | Jungkman et al. | 250/352 |
| 5,021,663 | 6/1991 | Hornbeck | 250/349 |
| 5,030,827 | 7/1991 | Powell . | |
| 5,118,944 | 6/1992 | Mori et al. | 250/338.4 |
| 5,122,666 | 6/1992 | Turnbull | 250/338.3 |
| 5,122,669 | 6/1992 | Herring et al. . | |
| 5,286,976 | 2/1994 | Cole | 250/349 |
| 5,288,649 | 2/1994 | Keenan | 437/3 |
| 5,300,915 | 4/1994 | Higashi et al. . | |
| 5,367,167 | 11/1994 | Keenan . | |
| 5,369,280 | 11/1994 | Liddiard | 250/370.08 |
| 5,397,897 | 3/1995 | Komatsu et al. | 250/338.4 |
| 5,399,897 | 3/1995 | Cunningham et al. . | |
| 5,404,125 | 4/1995 | Mori et al. . | |
| 5,438,200 | 8/1995 | Thornton | 250/338.4 |
| 5,446,284 | 8/1995 | Butler et al. . | |
| 5,450,053 | 9/1995 | Wood | 338/18 |
| 5,455,421 | 10/1995 | Spears | 250/338.4 |
| 5,479,018 | 12/1995 | McKee et al. | 250/338.1 |

FOREIGN PATENT DOCUMENTS

| | | | |
|---|---|---|---|
| 0 354 369 | 2/1990 | European Pat. Off. . | |
| 6137943 | 5/1994 | Japan | 250/338.4 |
| 2198879 | 6/1988 | United Kingdom . | |

Primary Examiner—Michael J. Tokar
Assistant Examiner—Richard Hanig
Attorney, Agent, or Firm—Merchant, Gould, Smith Edell, Welter & Schmidt

[57] ABSTRACT

The microbridge structure is for emitting or detecting radiations. According to one embodiment, it comprises a substrate layer provided with two first electrical contacts, and a microstructure provided with two second electrical contacts and having an underside, a top side opposite to the underside, through which radiations are emitted or received, at least one radiation active layer lying between the underside and the top side, the radiation active layer having two distal points connected respectively to the two second electrical contacts of the microstructure, and a radiation reflective layer lying between the underside and the radiation active layer. It also comprises a micro support for suspending the microstructure over and at a predetermined distance from the substrate layer with the underside of the microstructure facing the substrate layer. The micro support is provided with at least two electrically conductive paths for connecting respectively the two first electrical contacts to two second electrical contacts. The present invention is also concerned with methods for forming microbridge structures.

21 Claims, 26 Drawing Sheets

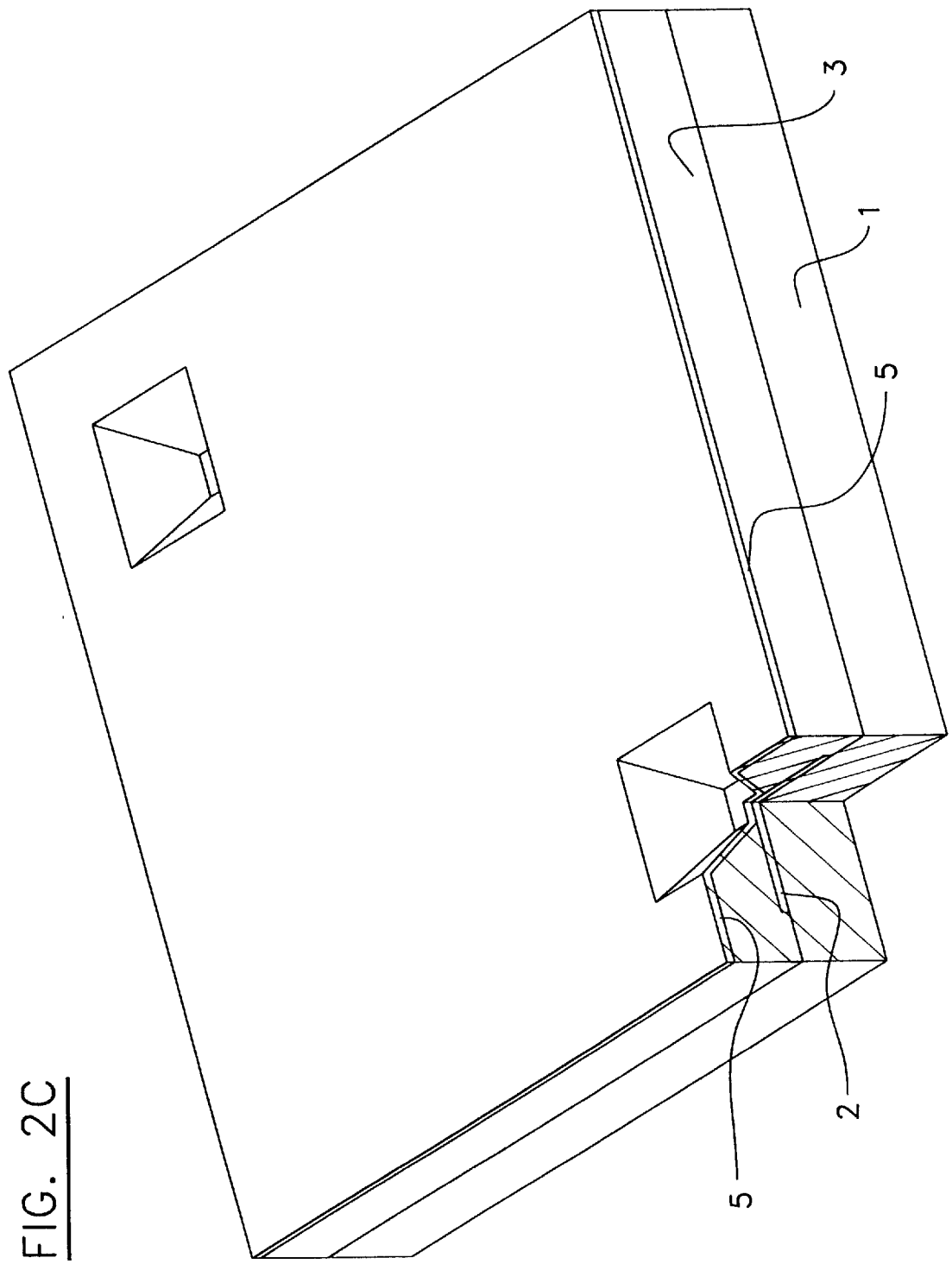

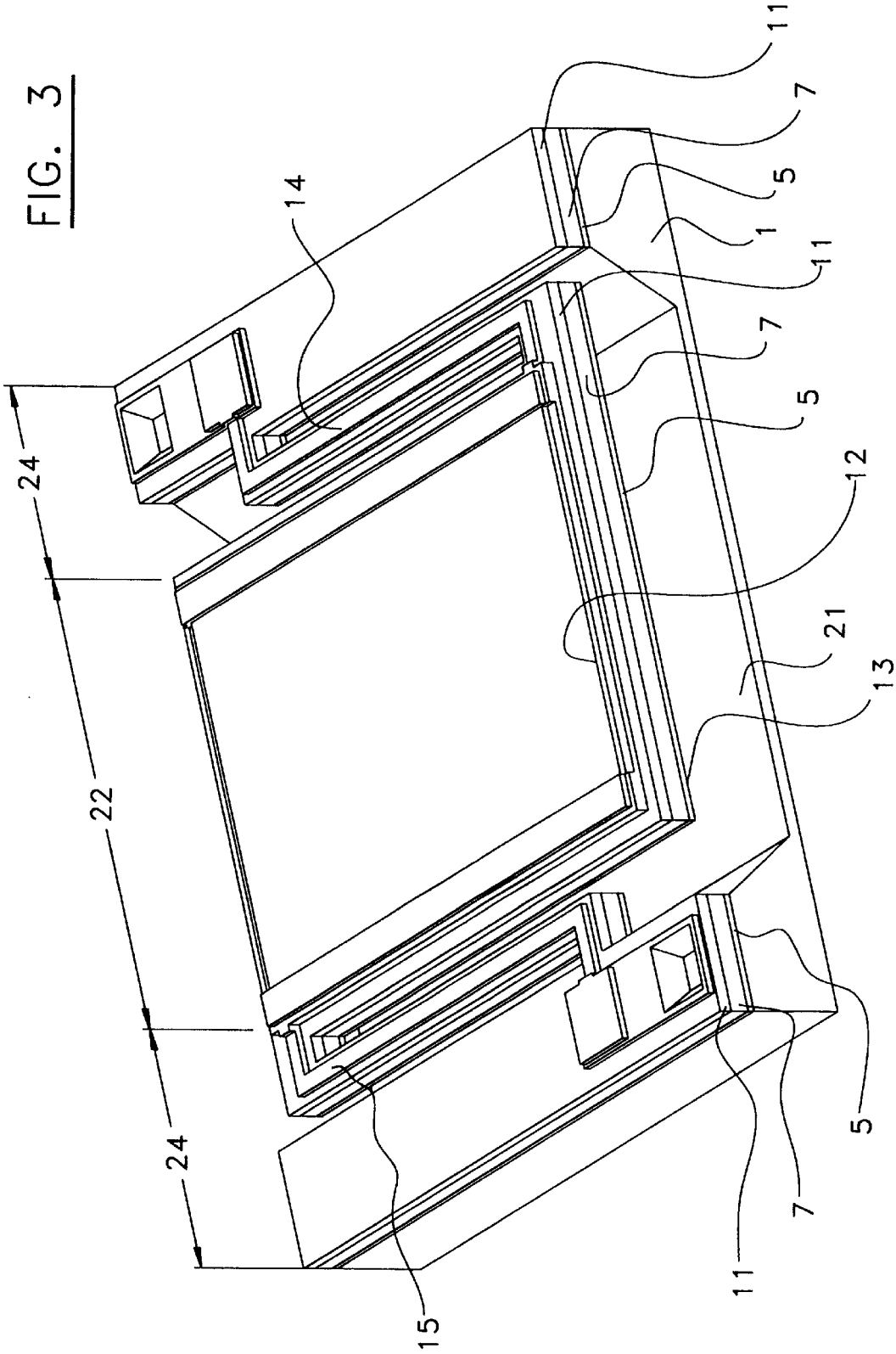

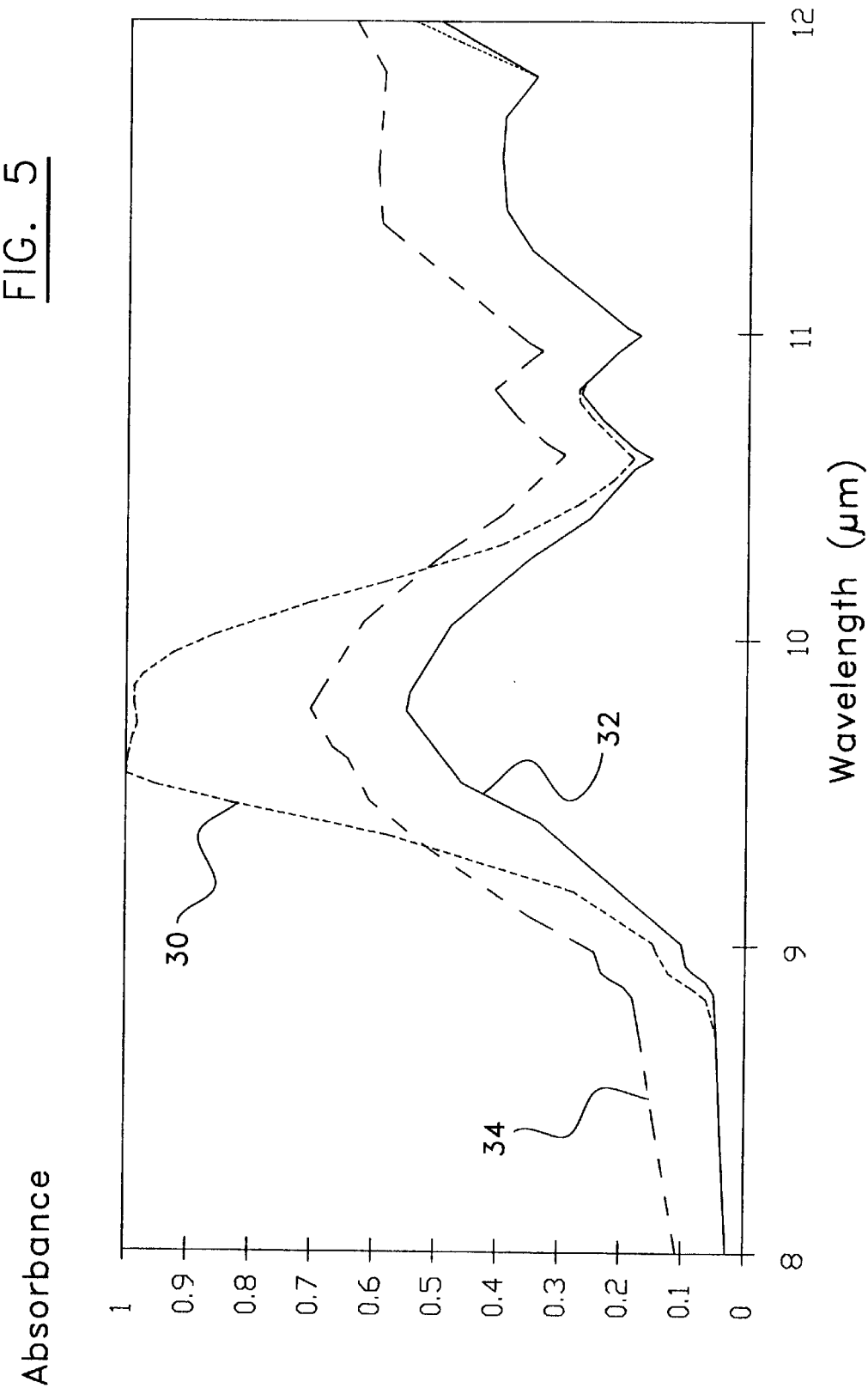

MICROBRIDGE STRUCTURE FOR EMITTING OR DETECTING RADIATIONS AND METHOD FOR FORMING SUCH MICROBRIDGE STRUCTURE

FIELD OF THE INVENTION

The present invention is concerned with a microbridge structure for emitting or detecting radiations, and with a method for forming such microbridge structure.

BACKGROUND OF THE INVENTION

In general, two types of $VO_2$ based uncooled infrared bolometric detectors have already been developed. In the first type of $VO_2$ based bolometric detectors, fabricated by the surface silicon micromachining technique, the $VO_2$ thermistor is embedded within a suspended microstructure. The microstructure is suspended over a substrate layer and separated therefrom by an air gap. The substrate layer is usually provided with a bolometer readout circuit integrated by means of a conventional integrated circuit fabrication process.

In this type of detector, the incident infrared radiation is absorbed, at least partially, by the microstructure, including a sensing layer which forms an integrated thermistor. Usually, due to the relatively low thickness of the microstructure layers, a significant part of the incident radiation is not absorbed, thereby lowering the sensitivity of the device.

One method of increasing absorption in the bolometric detector described above is to deposit an infrared reflective layer on the substrate layer. This infrared reflective layer constitutes a substrate mirror. This substrate mirror serves to reflect infrared radiation which is not absorbed on its first passage through the microstructure layers, back into the microstructure layers for additional absorption. A microstructure with an embedded thermistor is preferably located one quarter of the wavelength of the centre of the infrared spectral band of interest, above the substrate mirror to gain resonant performance.

Known in the art, there is the U.S. Pat. No. 5,286,976 granted to B. E. Cole where there is shown a substrate mirror. A substrate mirror is also mentioned in U.S. Pat. No. 5,021,663 granted to L. J. Hornbeck, in U.S. Pat. No. 5,288,649 granted to W. F. Keenan, in U.S. Pat. No. 5,122,666 granted to A. A. Turnbull, and in U.S. Pat. No. 5,479,018 granted to R. C. McKee et al., in other preferred device embodiments.

A drawback with the embodiments described in the above mentioned patents is that the substrate mirror is inherently very sensitive to any construction imperfections such as a nonplanarity of the substrate layer surface and deviations of the thickness of the air gap between the mirror and the microstructure, from the prescribed value. This obviously imposes some limitations on the device design flexibility and the fabrication process used. Moreover, the very presence of a substrate mirror limits the space available for other important components of the detector such as, for example, vias and contact pads providing electrical connection between the readout circuit integrated in the substrate layer and the sensing layer.

In a second type of the $VO_2$ based bolometric detectors fabricated by a bulk silicon micromachining technique, a $VO_2$ thermistor is embedded within a micromembrane, typically composed of two dielectric layers made of $SiO_2$ or $Si_3N_4$ with a thickness below one micrometer. This micromembrane is suspended over an anisotropically etched cavity, typically in a silicon wafer. The cavity has the form of a pyramid or a truncated pyramid. Radiation absorption in this device, typically less than 100%, takes place in the thermistor and in the micromembrane. Due to technical difficulties imposed by the form of the cavity, the substrate mirror described previously cannot be employed.

One method of increasing absorption in the described type of bolometric detector is to deposit an additional infrared absorbing layer on the surface of the device. This is described in the U.S. Pat. No. 5,450,053 granted to the R. A. Wood. This approach requires a proper selection of the absorber material and imposes limitations on the fabrication process used. The criteria for a good absorber is that it should exhibit a radiation absorption of 100%, should have a low thermal mass and should be easy to deposit and to pattern. It is difficult to satisfy all these criteria simultaneously.

A different method of increasing absorption is described in the U.S. Pat. No. 5,369,280 granted to K. C. Liddiard. In this patent, the thermistor material, preferably amorphous silicon, is enclosed within a pair of metallic contacts. In embodiments described in this patent, the lower and upper electrical contact films are essential components of the infrared absorption mechanism. The upper contact film has a thickness chosen to optimize radiation absorption thus also fulfilling the function of an absorber.

The use of the pair of metallic contacts enables an enhanced absorption achieved by virtue of the formation of an optical interference filter. The thickness of the thermistor layer is equal to $\lambda/4n$, where $\lambda$ is the wavelength of maximum absorption and n is the refractive index of the thermistor layer. In this design, the thickness of the thermistor layer has to be precisely controlled to achieve maximum absorption. Moreover, both the material and thickness of the upper contact layer have to be carefully selected to achieve the required effect. These factors impose severe limitations in terms of selection of the construction materials and the fabrication process used.

In a different embodiment from the same patent, a simple gap contact configuration is used. The metallic contact material and its thickness are selected to achieve radiation absorption, this means that the contacts serve as an absorber. Again, severe limitations are imposed on the contact material selection. Moreover, a high precision in the contact thickness control is required.

SUMMARY OF THE INVENTION

According to the present invention, there is provided a microbridge structure for emitting or detecting radiations, comprising:

a substrate layer provided with two first electrical contacts;

a microstructure provided with two second electrical contacts and having:

an underside, a top side opposite to the underside, through which radiations are emitted or received, at least one radiation active layer lying between the underside and the top side, the radiation active layer having two distal points connected respectively to the two second electrical contacts of the microstructure, and a radiation reflective layer lying between the underside and the radiation active layer; and a micro support for suspending the microstructure over and at a predetermined distance from the substrate layer with the underside of the microstructure facing the substrate layer, the micro support being provided with at least two electrically conductive paths for connecting respectively the two first electrical contacts to the two second electrical contacts.

According to the present invention, there is also provided a method for forming a microbridge structure comprising a microstructure and a micro support for suspending the microstructure, the microstructure being for emitting or detecting radiations, the method comprising the steps of:

(a) providing a substrate layer with electrical contacts;

(b) covering the substrate layer with a temporary layer, and patterning and etching cavities in the temporary layer to provide accesses to the electrical contacts of the substrate layer, the cavities being also for containing legs of the micro support, each of the cavities extending along a vertical axis and having a lower end opened out onto the electrical contacts of the substrate layer;

(c) covering the layers of previous steps (a) and (b) with a radiation reflective layer;

(d) patterning and etching the radiation reflective layer;

(e) covering the layers of previous steps (a) to (d) with a first dielectric layer;

(f) patterning and etching the first dielectric layer to provide accesses to the electrical contacts of the substrate layer;

(g) covering the layers of previous steps (a) to (f) with a first electrically conductive layer;

(h) patterning and etching the electrically conductive layer so that the electrically conductive layer forms a part of the micro support and provides an electrical path to the electrical contacts of the substrate layer;

(i) covering the layers of previous steps (a) to (h) with a radiation active layer;

(j) patterning and etching the radiation active layer to define an active area for emitting or detecting radiations;

(k) covering the layers of previous steps (a) to (j) with a second electrically conductive layer, and patterning and etching the second electrically conductive layer so that said second electrically conductive layer provides two electrical paths from two distal points of the radiation active layer to the electrical contacts of the substrate layer through the first electrically conductive layer;

(l) patterning and etching the first dielectric layer down to the temporary layer; and (m) removing the temporary layer to reveal the microstructure which comprises a radiation reflective layer and the radiation active layer, and which is suspended by means of the micro support.

According to the present invention, there is also provided a method for forming a microbridge structure comprising a microstructure and a micro support for suspending the microstructure, the microstructure being for emitting or detecting radiations, the method comprising the steps of:

(a) providing a substrate layer provided with electrical contacts;

(b) covering the substrate layer with a first dielectric layer;

(c) covering the layers of previous steps (a) and (b) with a radiation reflective layer;

(d) patterning and etching the radiation reflective layer;

(e) covering the layers of previous steps (a) to (d) with a second dielectric layer to embed the radiation reflective layer within the first and second dielectric layers;

(f) covering the layers of previous steps (a) to (e) with a radiation active layer;

(g) patterning and etching the radiation active layer to define an active area for emitting or detecting radiations;

(h) covering the layers of previous steps (a) to (g) with a first electrically conductive layer;

(i) patterning and etching the first electrically conductive layer so that said first electrically conductive layer provides two electrical paths from two distal points of the radiation active layer;

(j) patterning and etching of the first and the second dielectric layers down to the electrical contacts of the substrate layer;

(k) covering the layers of previous steps (a) to (j) with a second electrically conductive layer, and patterning and etching the second electrically conductive layer so that said second electrically conductive layer provides electrical paths from the electrical contacts of the substrate layer to the radiation active layer through the two electrical paths provided in the step (i);

(l) patterning and etching the first and second dielectric layers down to the substrate layer; and (m) etching the substrate layer to reveal the microstructure which comprises the radiation active layer and the radiation reflective layer and which is suspended by means of the micro support.

Further objects, advantages and other features of the present invention will become more apparent upon reading of the following non-restrictive description of preferred embodiments thereof given for the purpose of exemplification only with reference to the accompanying drawings.

BRIEF DESCRIPTION OF THE DRAWING

FIG. 2C is a perspective view of a method step for forming the microbridge structure of FIG. 1, according to the present invention;

FIG. 3 is a perspective view of another microbridge structure according to the present invention;

FIG. 5 is a diagram of absorbance versus wavelength for various bolometer structures.

DETAILED DESCRIPTION OF THE DRAWINGS

This invention relates generally to microstructures being part of various types of micro sensors and other micro devices whose operation is based on absorption or emission of electromagnetic radiation. In a preferred embodiment, the micro sensor is an uncooled infrared $VO_2$ based bolometric detector and the microstructure is a suspended multi layer microstructure. Although the given description is basically in terms of an individual microstructure, the invention equally applies to uni- and bi-dimensional multi-element arrays of such microstructures, for example the arrays of bolometric detectors.

Figure 1:
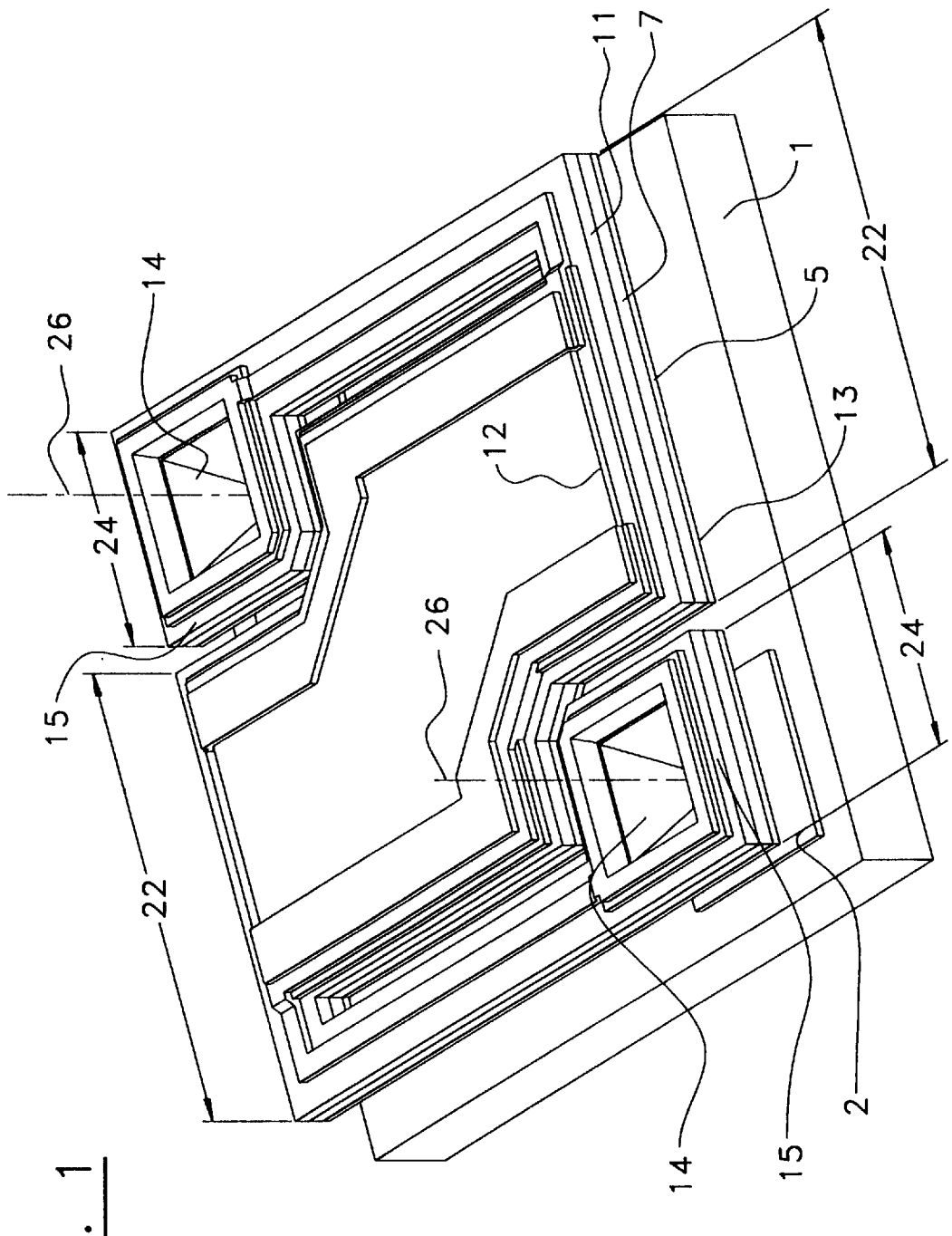
FIG. 1 is a perspective view of a microbridge structure according to the present invention.

Referring now to FIG. 1, there is shown a microbridge structure for emitting or detecting radiations. It comprises a substrate layer 1 provided with two first electrical contacts 2 (only one contact is shown, the other is similar to the one shown and is in the opposite corner of the structure), and a microstructure 22 provided with two second electrical contacts 16 shown in FIG. 2I. The microstructure 22 is provided with slots cut through its entire thickness in order to elongate the path of heat conduction from the microstructure 22 to its micro support 24, and thus improving thermal isolation of the microstructure 22 from the substrate layer 1. The substrate layer 1 is typically a planarized silicon wafer with a bolometer readout circuit (not shown) manufactured by means of a conventional integrated circuit fabrication process. This substrate layer 1 has metal surface contact pads 2 providing electrical connection between the electronic readout circuit and a radiation active layer 9, shown in FIG. 2H, and which will be more fully described herein below.

Figure 2A:
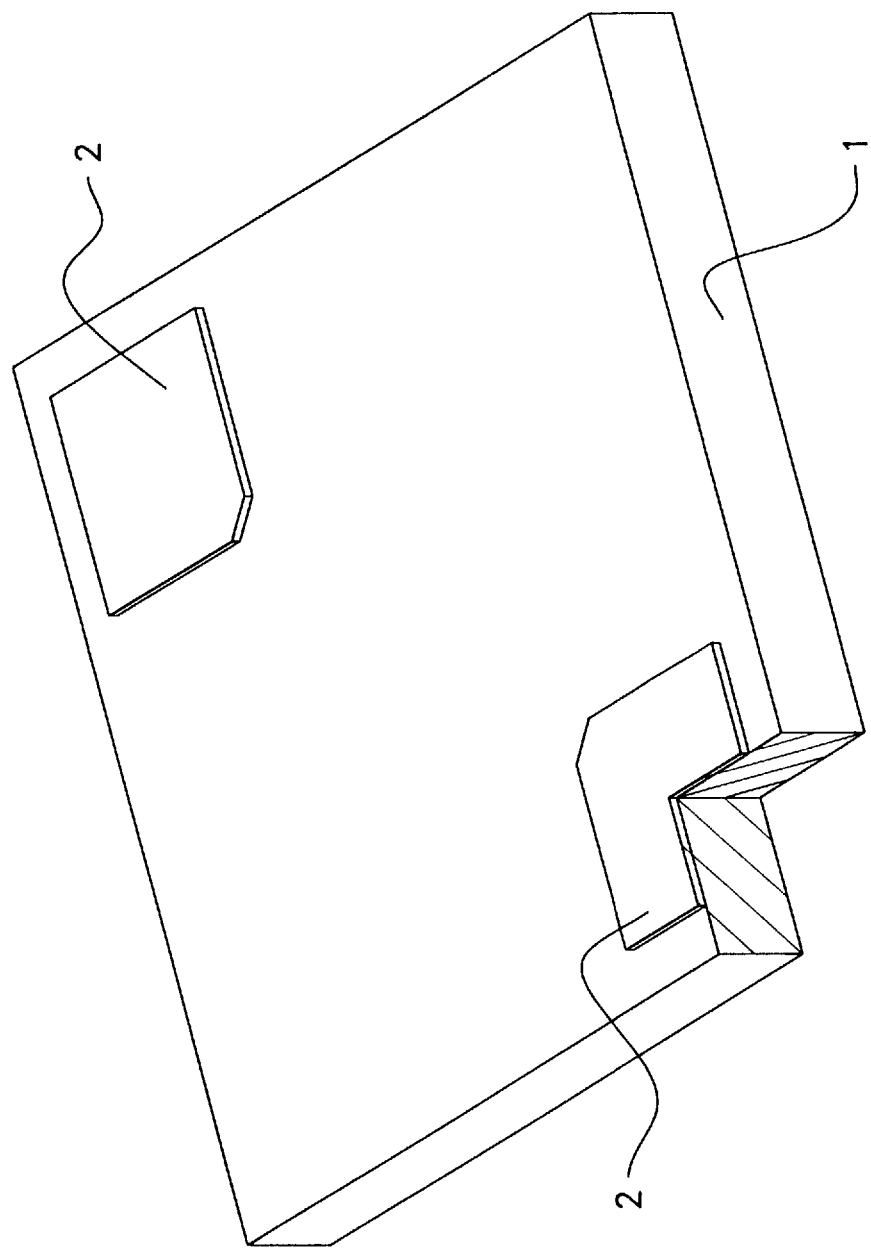
FIG. 2A is a perspective view of a method step for forming the microbridge structure of FIG. 1, according to the present invention.
Figure 2B:
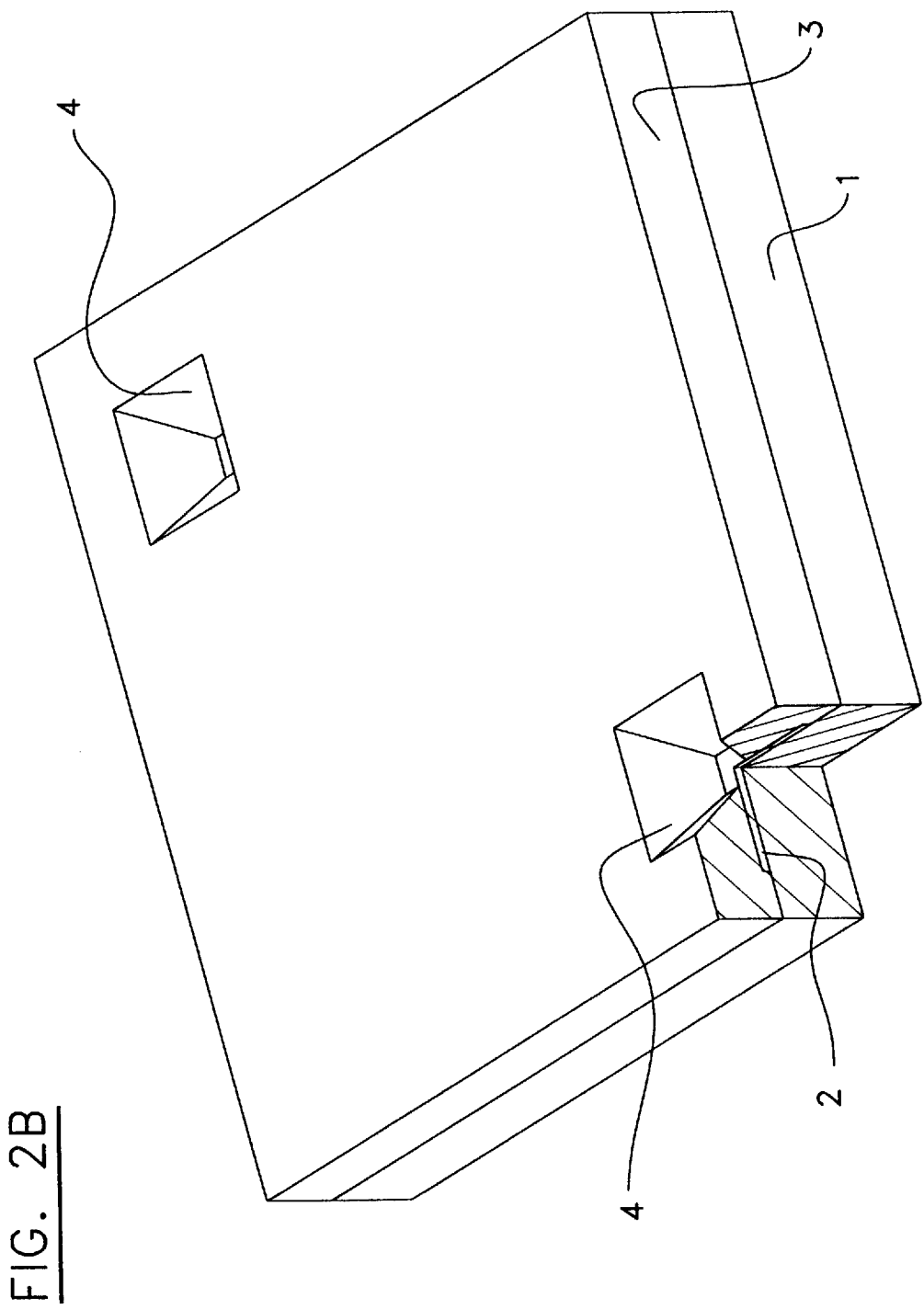
FIG. 2B is a perspective view of a method step for forming the microbridge structure of FIG. 1, according to the present invention.

The microstructure 22 has an underside 13 and a top side 12 opposite to the underside 13. Radiations are emitted or received through the top side 12. It also has a radiation active layer 9 shown on FIG. 2H lying between the underside 13 and the top side 12. The radiation active layer 9 has two distal points connected respectively to the two second electrical contacts 16 of the microstructure 22 as shown on FIG. 2I. Preferably, the radiation active layer 9 shown on FIG. 2H is responsive to temperature changes caused by absorbed infrared radiations and it is then made of a material exhibiting a substantially high temperature coefficient of resistivity. It has a thickness of substantially 0.1 to 0.5 $\mu$m, and a surface dimension of about 50 $\mu$m by 50 $\mu$m.

Preferably, the material exhibiting a substantially high temperature coefficient of resistivity is selected from the group consisting of $VO_2$, $V_2O_3$ and a-Si, whereby the microbridge structure forms an uncooled infrared bolometric detector.

Also, preferably, the radiation active layer 9 is for heating the microstructure so that it emits infrared radiations. It is then made of a material selected from the group consisting of polysilicon, graphite, titanium oxides, tantalum oxides, silicon oxides, cermets, nichrome and TiN.

Figure 2D:
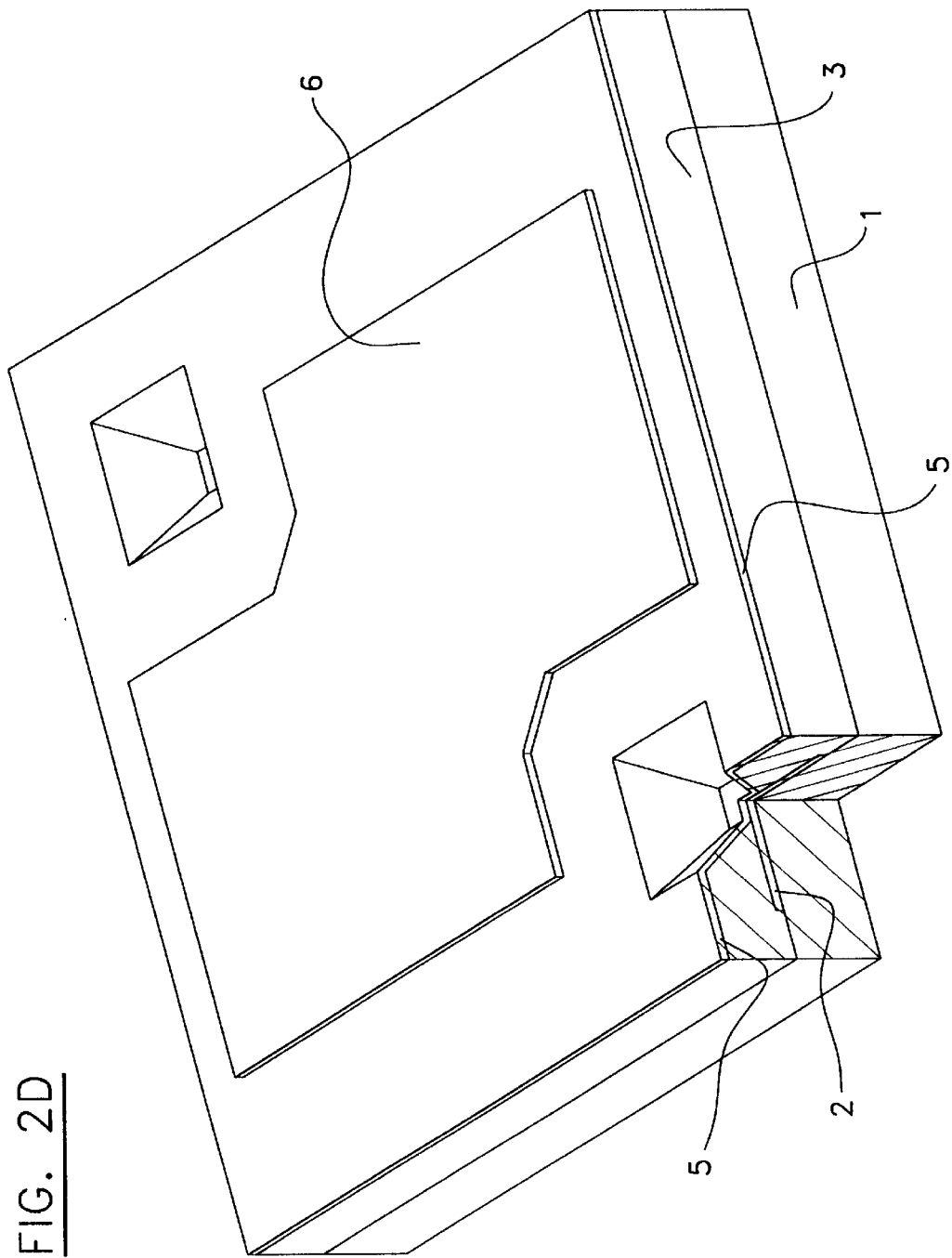
FIG. 2D is a perspective view of a method step for forming the microbridge structure of FIG. 1, according to the present invention.
Figure 2E:
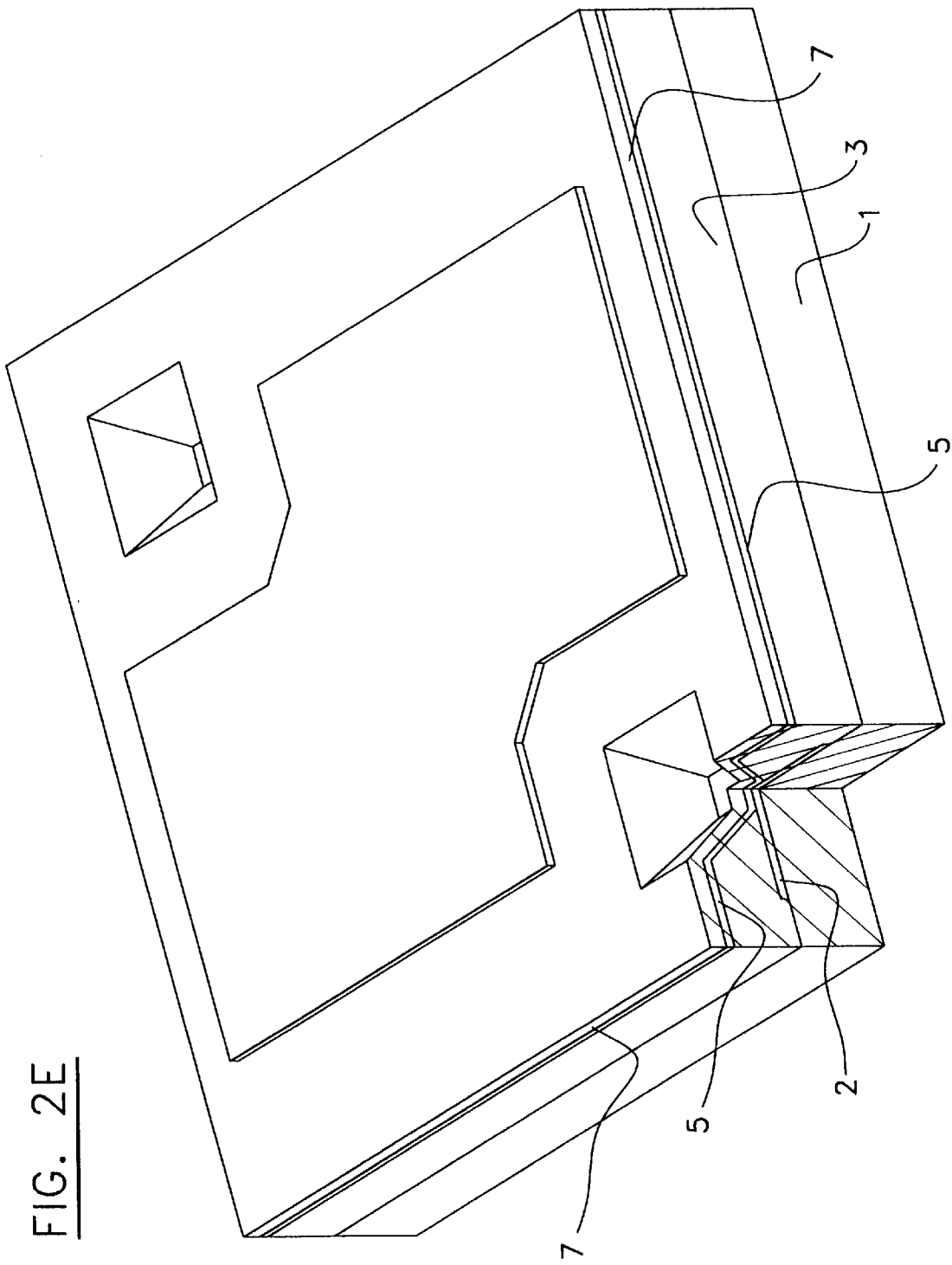
FIG. 2E is a perspective view of a method step for forming the microbridge structure of FIG. 1, according to the present invention.
Figure 2F:
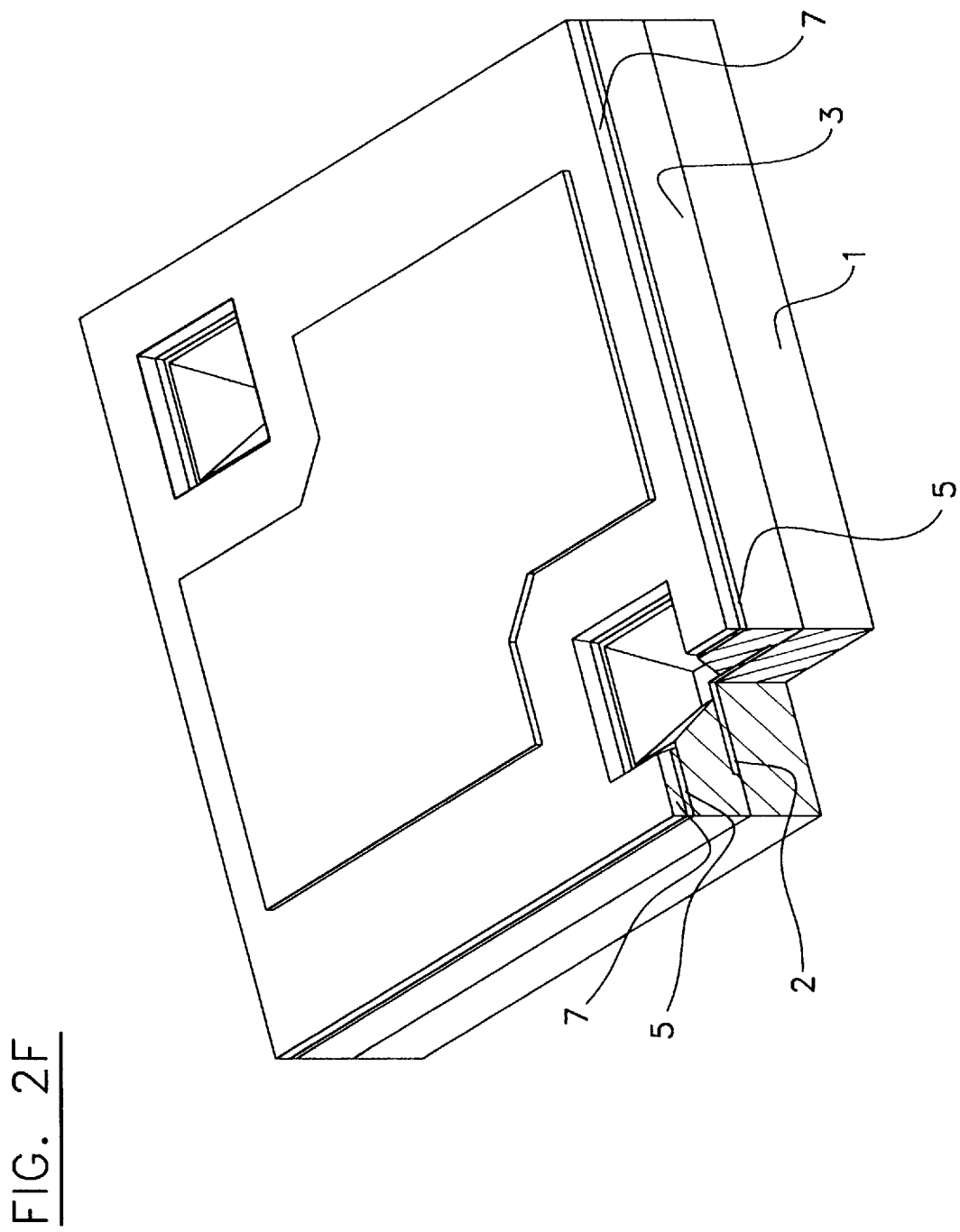
FIG. 2F is a perspective view of a method step for forming the microbridge structure of FIG. 1, according to the present invention.
Figure 2G:
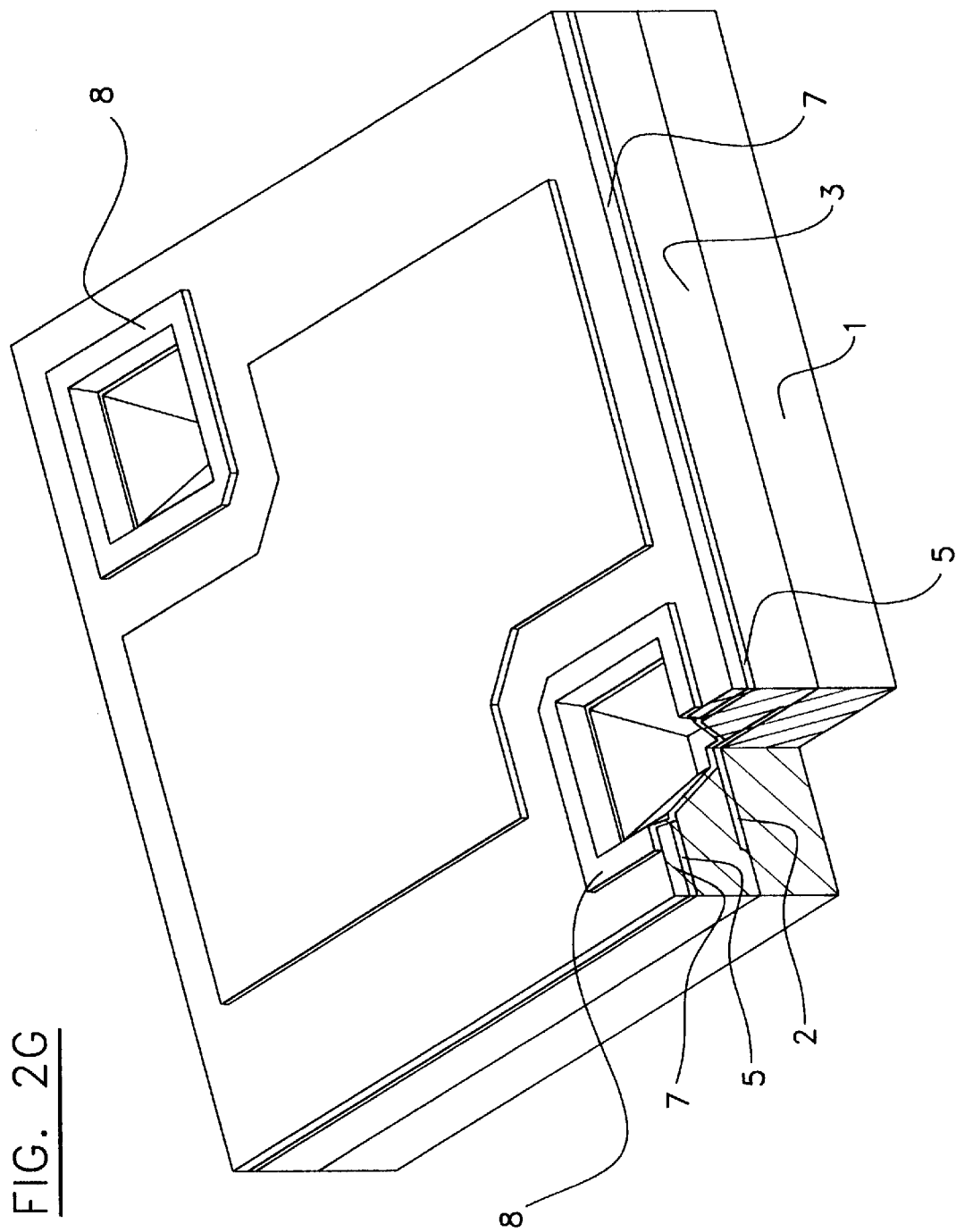
FIG. 2G is a perspective view of a method step for forming the microbridge structure of FIG. 1, according to the present invention.
Figure 2H:
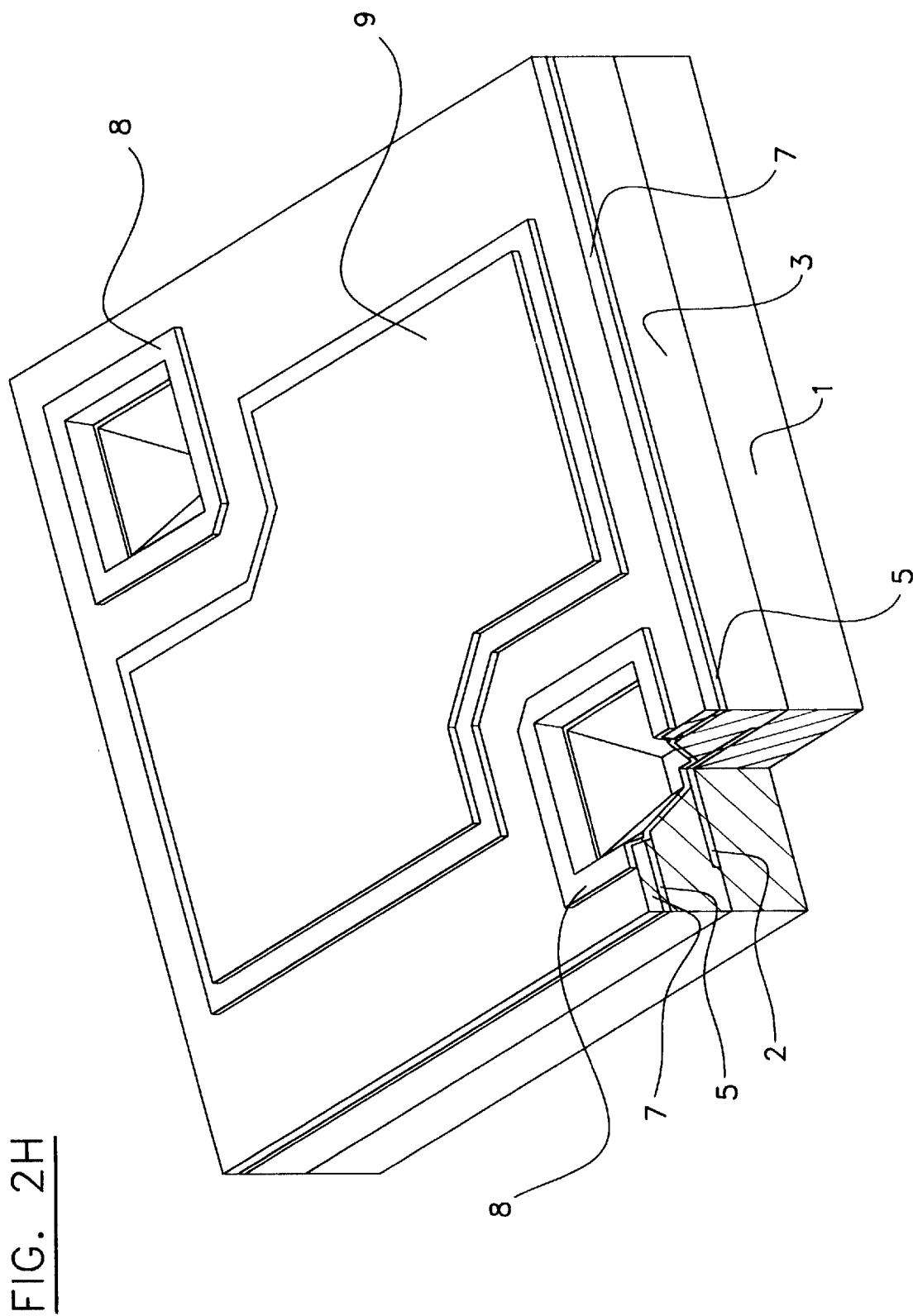
FIG. 2H is a perspective view of a method step for forming the microbridge structure of FIG. 1, according to the present invention.

The microstructure 22 also comprises a radiation reflective layer 6, shown on FIG. 2D, lying between the underside 13 and the radiation active layer 9 shown on FIG. 2H. The radiation reflective layer 6 shown on FIG. 2D is preferably made of a material selected from the group consisting of Au, Al, Pt and TiN and it has a thickness of substantially a fraction of 1 $\mu$m.

The microbridge structure also comprises a micro support 24 for suspending the microstructure 22 over and at a predetermined distance from the substrate layer 1 with the underside 13 of the microstructure 22 facing the substrate layer 1. The micro support 24 is provided with at least two electrically conductive paths for connecting respectively the two first electrical contacts 2 to the two second electrical contacts 16 as better seen on FIG. 2I.

Preferably, the microstructure 22 further comprises upper and lower dielectric layers 11 and 7. The upper dielectric layer 11 lies over the radiation active layer 9 shown on FIG. 2H, and the lower dielectric layer 7 lies between the radiation active layer 9 shown on FIG. 2H and the radiation reflective layer 6 shown on FIG. 2D. The dielectric layer 7 provides electrical isolation of the radiation reflective layer 6 from the radiation active layer 9. The dielectric layer 11 provides a mechanical support to the microstructure.

Also preferably, the microstructure 22 further comprises an underside dielectric layer 5. The underside dielectric layer 5 lies between the underside 13 of the microstructure 22 and the radiation reflective layer 6 shown on FIG. 2D, whereby the radiation reflective layer is embedded between the lower dielectric layer 7 and the underside dielectric layer 5. This underside layer 5 will provide a protection to the radiation reflective layer 6 shown in FIG. 2D against possible damages during the fabrication process.

Preferably, the dielectric layers 5, 7 and 11 are made of a material selected from the group consisting of $Si_3N_4$ and $SiO_2$. Each of the dielectric layers 5, 7 and 11 has a thickness of substantially 0.1 to a few µms.

Preferably, the micro support 24 has two legs 14 each extending along a vertical axis 26. Each of the legs 14 has a central upper cavity extending along the vertical axis 26 within the leg 14. Each of the legs 14 has a lower end connected to the substrate layer 1 and an upper end connected to the microstructure 22 for supporting it with respect to the substrate layer 1. Each of the legs 14 is a multilayer leg comprising layers 8 and 10 of electrically conductive material shown on FIGS. 2H to 2L.

Figure 2I:
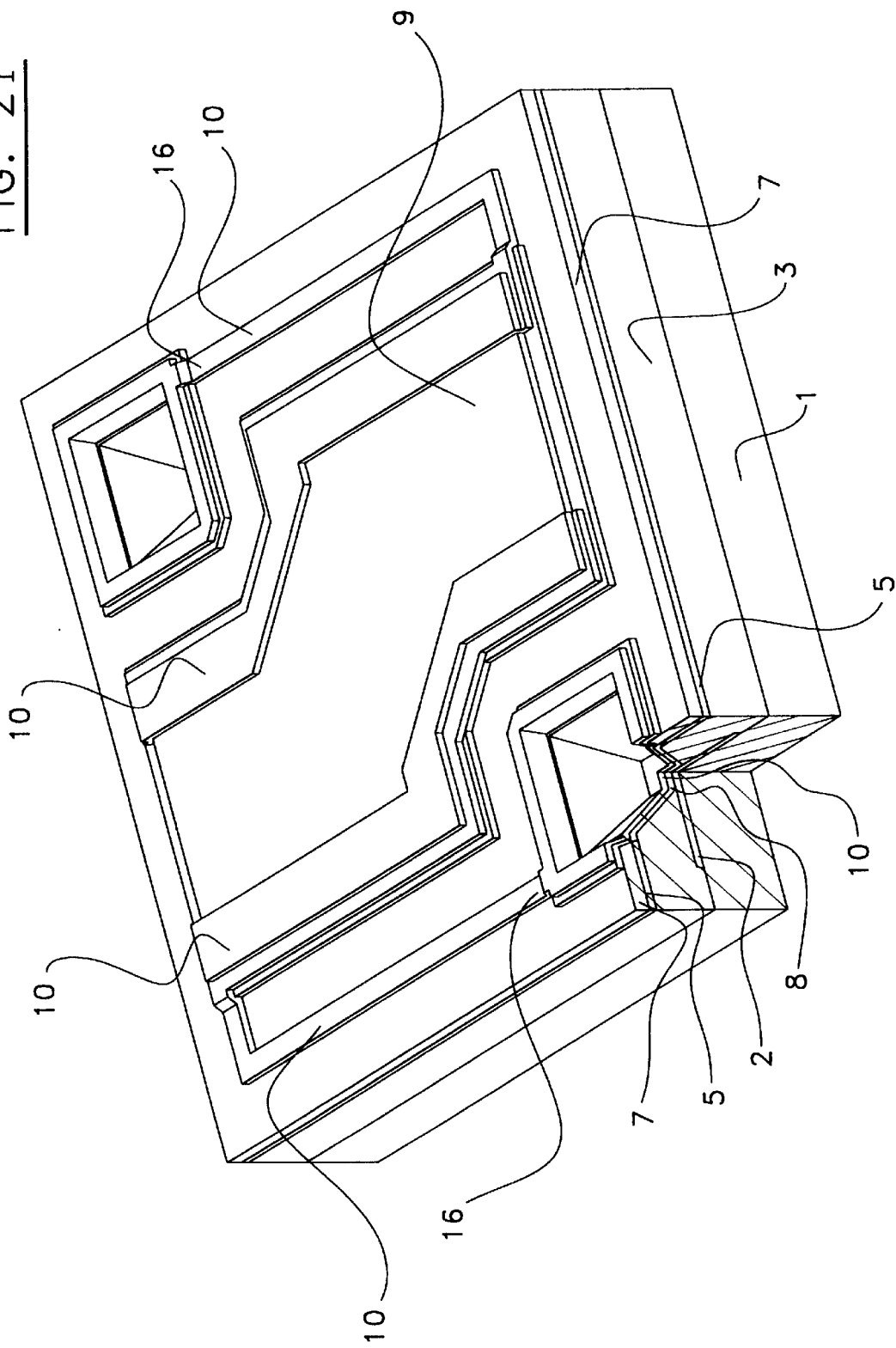
FIG. 2I is a perspective view of a method step for forming the microbridge structure of FIG. 1, according to the present invention.

The layer 10 of each of the legs 14 is extending from the upper end to the lower end thereof and is connecting one of the two second electrical contacts 16, shown on FIG. 2I, of the microstructure 22 to one of the two first electrical contacts 2 of the substrate layer 1 via the layer 8. As better shown on FIG. 2J, the third layer 11 of dielectric material covers the layers 10 and 8 of electrically conductive material. The layer 8 provides a mechanical support to the microstructure and an electrical connection between the sensing layer and the electrical contacts 2 of the substrate layer 1.

The layer 8 must exhibit mechanical properties required for the construction of the legs 14. The material of the layer 10 can be selected only from the point of view of its application, which means in respect to the material of the electrodes of the radiation active layer. The dielectric layer 11 encapsulates and thus protects the layer 10, and it increases the mechanical strength of the legs 14 of the micro support.

Preferably, the layers 8 and 10 are made of a material selected from the group consisting of Au, Ti, W, Al and V, and each has a typical thickness of less than 1 µm. Also preferably, each of the legs 14 has substantially the shape of an upside down hollow truncated pyramid.

Preferably, each of the multilayer legs 14 has an upper portion made of upper parts of its layers and shaped as a collar 15 with a width of substantially 1 to 2 µm. The collar 15 is mechanically, thermally and electrically connected to the microstructure. The microstructure 22 is suspended over the substrate layer 1 at a distance of typically 1 to 3 µm. The legs 14 are located at diagonally opposite corners of the microstructure 22.

Referring now to FIGS. 2A to 2L, there are shown the steps of a method for forming the microbridge structure shown in FIG. 1. The microstructure 22 is for emitting or detecting radiations.

The method comprises steps of (a) providing a substrate layer 1 with electrical contacts 2 as shown on FIG. 2A, and (b) covering the substrate layer 1 with a temporary layer 3 as shown in FIG. 2B. The temporary layer 3 is a polyimide layer with a thickness of 1 to 3 µm. It is deposited on the substrate layer 1 by means of a spin coating method. The substrate layer 1 is provided with readout electronics (not shown). The polyimide is subsequently baked to ensure its stability at elevated temperatures. Different materials can be used for temporary layer, such as glass, $SiO_2$, Si, etc.

Step (b) further comprises patterning and etching cavities 4 in the temporary layer 3 to provide accesses to the electrical contacts 2 of the substrate layer 1 as shown in FIG. 2B. The cavities 4 are also for containing legs 14 of the micro support 24 shown on FIG. 1. Each of the cavities 4 extends along a vertical axis 26 shown on FIG. 1 and it has a lower end opened out onto the electrical contacts 2 of the substrate layer 1. The cavities 4 can have perpendicular or sloped walls. They are formed in the temporary layer 3 by means of the combination of a standard photolithographic process and a reactive ion etching process also known as the RIE process.

Preferably, the step (b) further comprises, after the patterning and etching of the temporary layer 3, a step (b+) of covering the layers of steps (a) and (b) with a dielectric layer 5 as shown on FIG. 2C. The dielectric layer 5 is deposited by means of a plasma enhanced chemical vapour deposition technique also known as the PECVD technique. This is the first layer used for the construction of the microstructure.

The method also comprises steps of (c) covering the layers of previous steps (a) and (b) with a radiation reflective layer 6, and (d) patterning and etching the radiation reflective layer 6 as shown on FIG. 2D. The radiation reflective layer 6 is a reflecting metal layer deposited by means of a physical vapour deposition technique also known as the PVD technique, and then patterned by means of a lift-off process or the combination of a standard photolithographic process and a dry or wet etching process.

Then, there is carried out step of (e) covering the layers of previous steps (a) to (d) with a dielectric layer 7 as shown on FIG. 2E. The dielectric layer 7 is deposited by means of the PECVD technique.

Then, there is a step of (f) patterning and etching the dielectric layers 5 and 7 to provide accesses to the electrical contacts 2 of the substrate layer 1 as shown on FIG. 2F. The dielectric layer 5, in combination with the dielectric layer 7, embeds the radiation reflective layer 6 shown in FIG. 2D. Both dielectric layers 5 and 7 are patterned by means of the combination of a standard photolithographic process and a RIE process. They are etched away inside and in the vicinity of the cavities previously etched in the temporary layer 3.

The method further comprises step (g) of covering the layers of previous steps (a) to (f) with a first electrically conductive layer 8, and (h) patterning and etching the electrically conductive layer 8 so that it forms a part of the micro support 24 and provides an electrical path to the electrical contacts 2 of the substrate layer 1 as shown on FIG. 2G. The conductive layer 8 is deposited by means of the PVD technique and then patterned by means of either a lift-off technique or the combination of a photolithographic technique and a dry or wet etching technique. This conductive layer 8 is the first construction layer of the legs of the micro support. It should be appreciated that the order of the steps (b+) to (f) can be reversed with the order of step (g) and (h).

The method also comprises steps of (i) covering the layers of previous steps (a) to (h) with a radiation active layer 9, (j) patterning and etching the radiation active layer 9 to define an active area for emitting or detecting radiations as shown in FIG. 2H. The layer 7 provides electrical isolation of the reflective layer 6 from the radiation active layer 9 which forms a thermistor. The conductive layers 8 provide electrical contacts between the thermistor and contact pads 2 of the substrate layer 1 via the conductive layers 10. The radiation active layer 9 is a $VO_2$ layer deposited by means of a reactive sputtering technique, and then reticulated to define the bolometer thermistor by means of the combination of a standard photolithographic process and a RIE process. In this embodiment, the bolometer thermistor is made of $VO_2$ but any other material with an appropriate temperature coefficient of resistivity, also known as TCR, such as $V_2O_3$ or a-silicon, can be used.

Then, there is a step of (k) covering the layers of previous steps (a) to (j) with a second electrically conductive layer 10, and patterning and etching it so that it provides two electrical paths from two distal points of the radiation active layer 9 to the electrical contacts 2 of the substrate layer 1 through the first electrically conductive layer 8 as shown on FIG. 2I. The conductive layer 10 forms the bolometer metal electrodes for connecting the bolometer thermistor with the readout electronics. The bolometer metal electrodes are fabricated by means of a lift-off process or by means of a dry or wet patterning of a metal layer deposited by a PVD technique. It should be appreciated that the order of steps (i) and (j) can be reversed with the order of step (k).

Figure 2J:
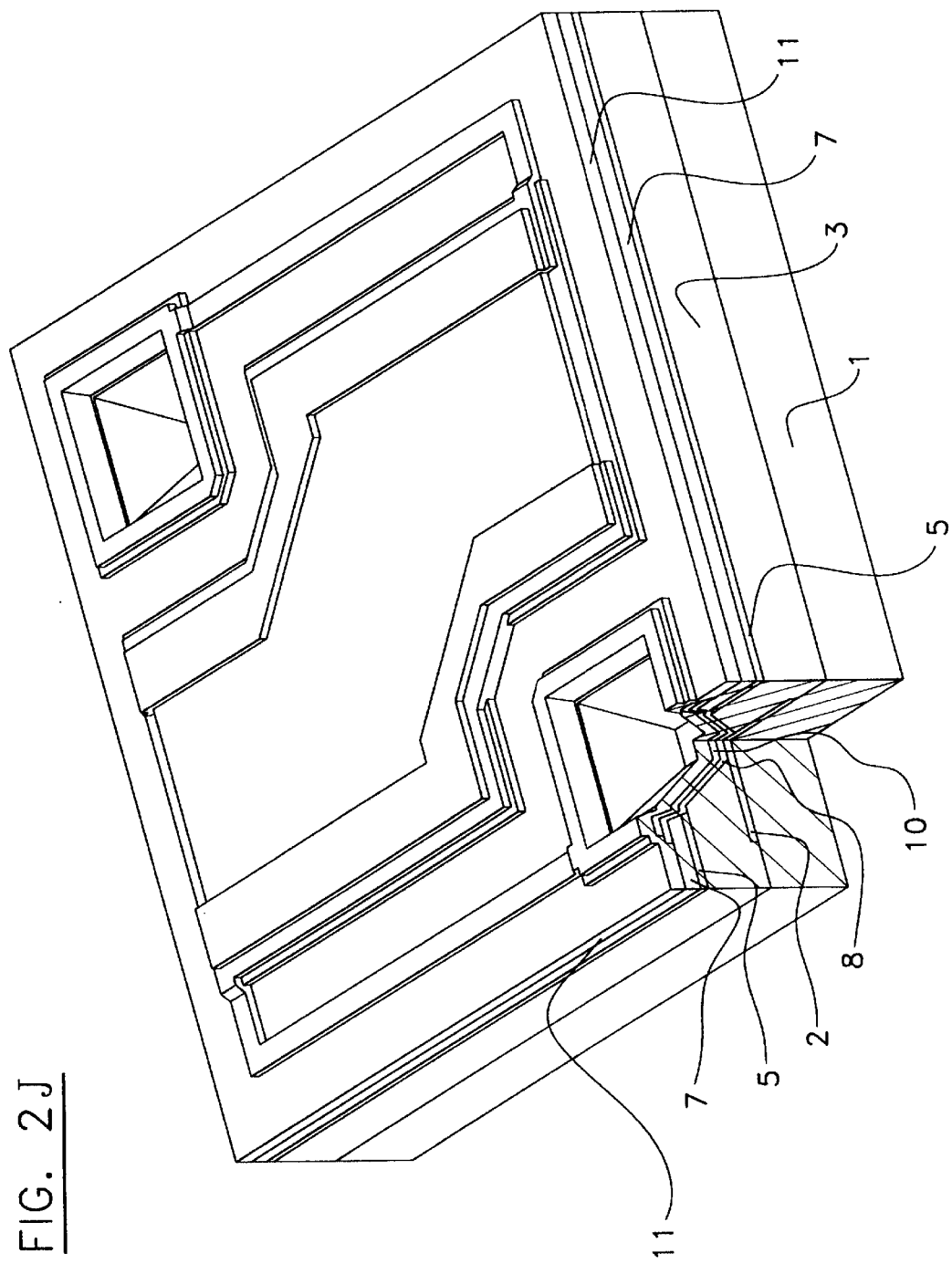
FIG. 2J is a perspective view of a method step for forming the microbridge structure of FIG. 1, according to the present invention.

Preferably, the step (k) further comprises, after the patterning and etching of the second electrically conductive layer 10, a step of covering the layers of the steps (a) to (k) with a third dielectric layer 11 to cover the second electrically conductive layer 10 and the radiation active layer 9 as shown on FIG. 2J. The third dielectric layer 11 is deposited by means of a PECVD technique. This is the third dielectric layer 11 used for the construction of the microstructure.

Figure 2K:
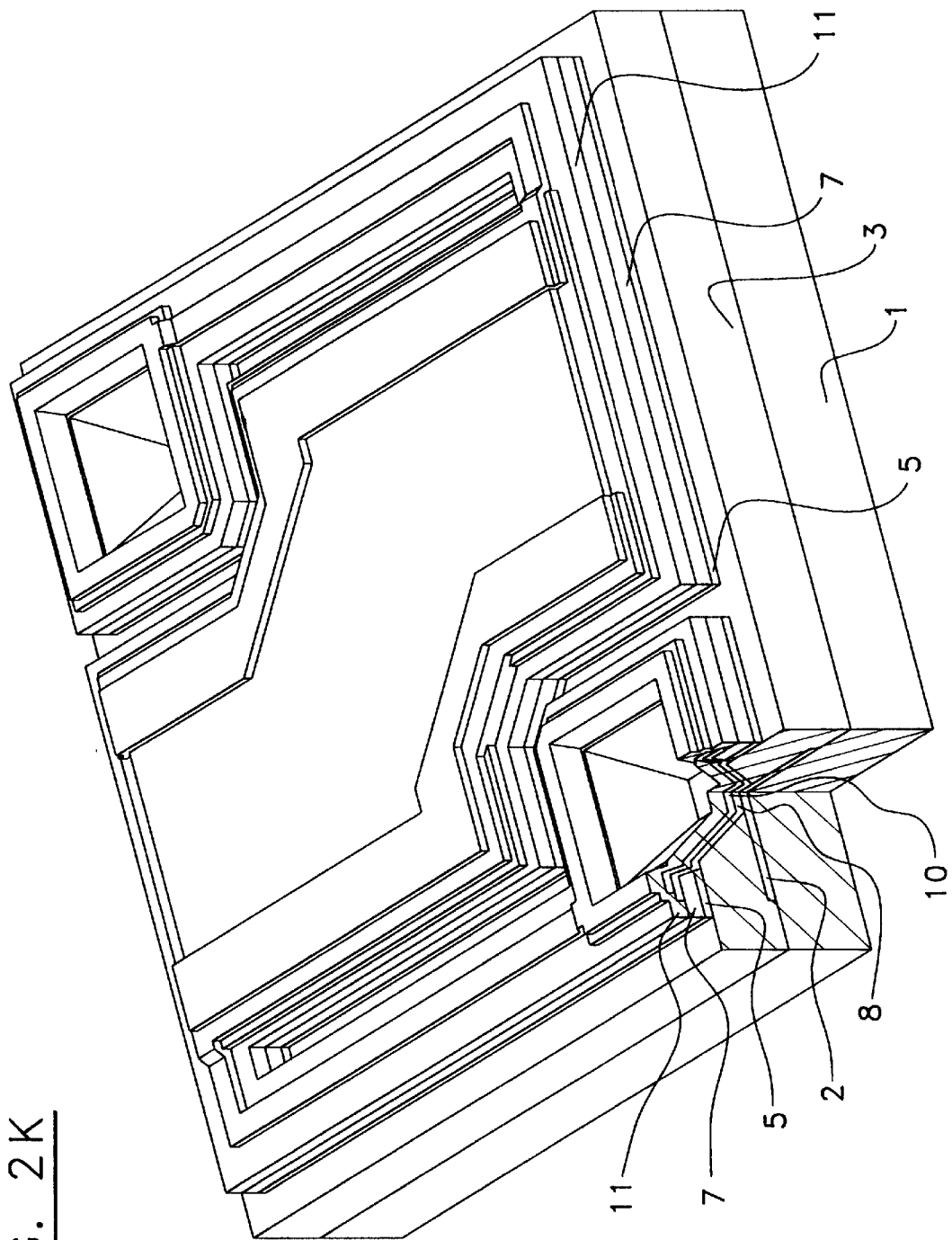
FIG. 2K is a perspective view of a method step for forming the microbridge structure of FIG. 1, according to the present invention.

Then, there is a step of (l) patterning and etching the dielectric layers 5, 7 and 11 down to the temporary layer 3 as shown on FIG. 2K. All three dielectric layers 5, 7 and 11 are reticulated down to the polyimide layer 3 in order to define the geometrical form of the microstructure and its micro support. This is done by means of the combination of a standard photolithographic process and a RIE process.

Figure 2L:
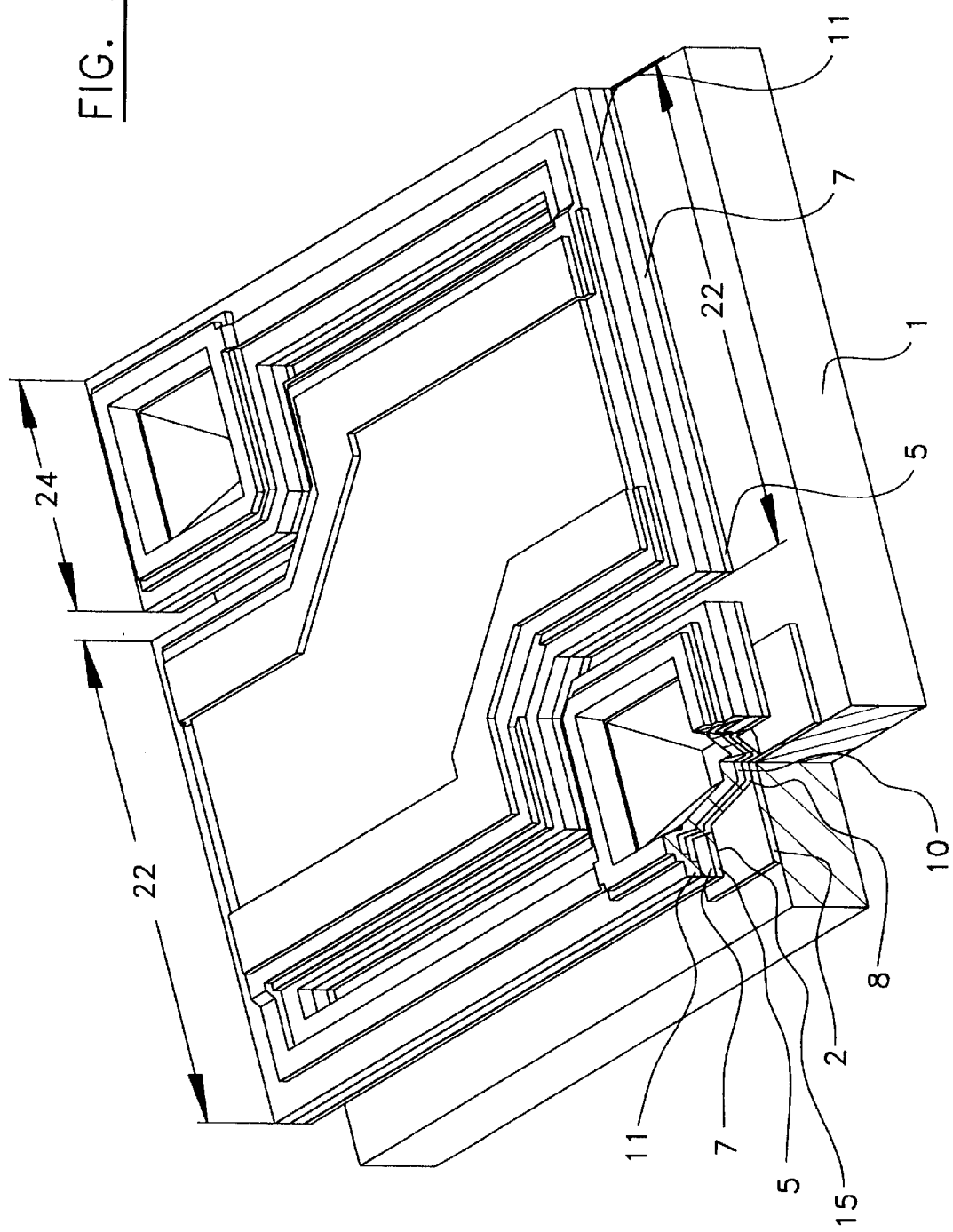
FIG. 2L is a perspective view of a method step for forming the microbridge structure of FIG. 1, according to the present invention.

Finally, there is a step of (m) removing the temporary layer 3 to reveal the microstructure 22 which comprises the radiation reflective layer and the radiation active layer, and which is suspended by means of the micro support 24, as shown in FIG. 2L. The temporary layer 3 which is a polyimide layer is removed by means of an oxygen plasma process thus revealing the suspended microstructure 22. The temporary layer 3 can be also removed by means of an isotropic wet or dry etching designed not cause any damage to microbridge structure.

Referring now to FIG. 3, there is shown another microbridge structure for emitting or detecting radiations. It comprises a substrate layer 1 provided with two first electrical contacts 2 shown on FIG. 4A, and a microstructure 22 provided with two second electrical contacts 16 shown on FIG. 4G.

The microstructure 22 has an underside 13 and a top side 12 opposite to the underside 13. Radiations are emitted or received through the top side 12. It also has a radiation active layer 9 shown on FIG. 4E laying between the underside 13 and the top side 12. The radiation active layer 9 has two distal points connected respectively to the two second electrical contacts 16 shown on FIG. 4F of the microstructure 22.

Figure 4A:
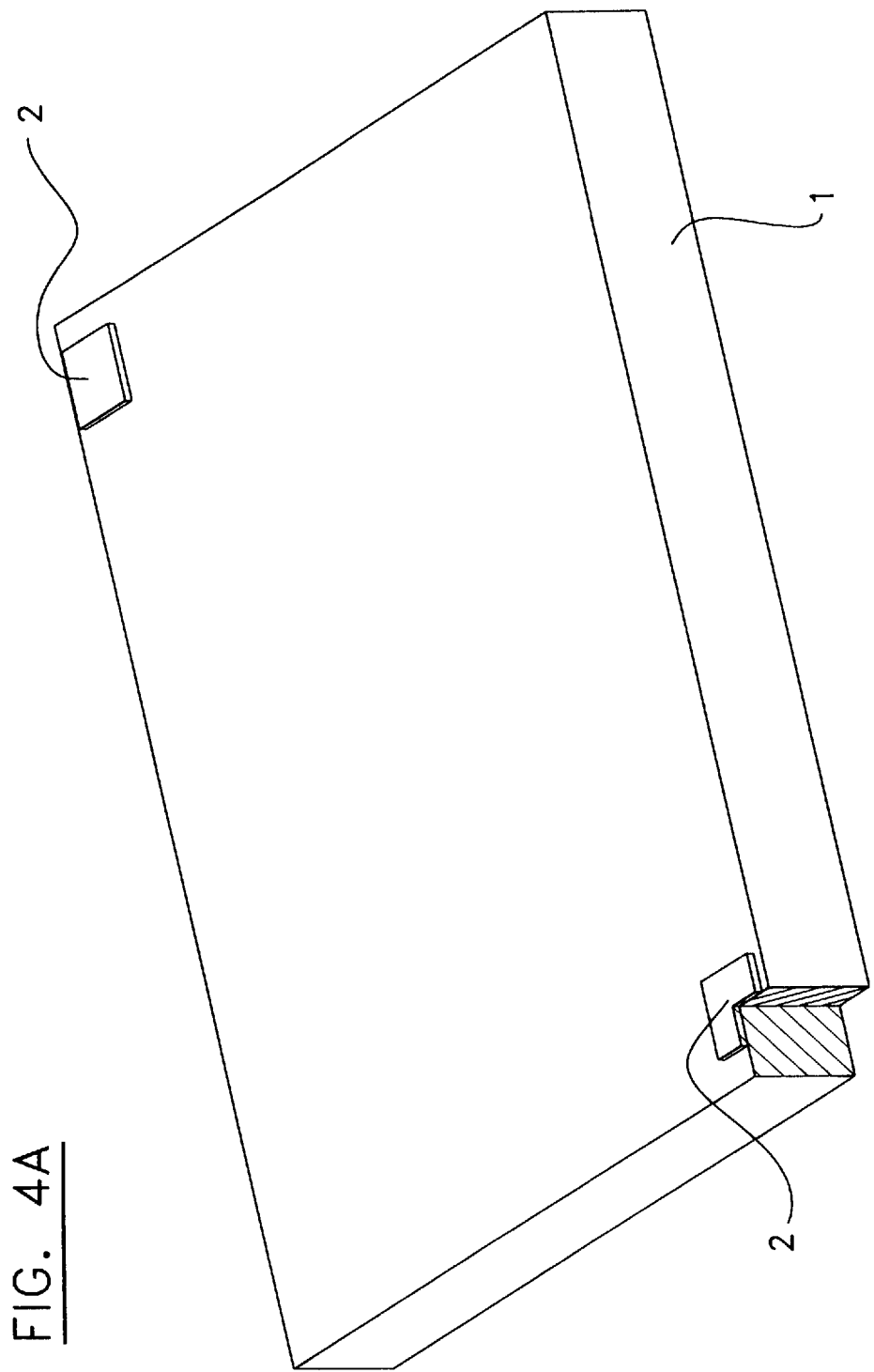
FIG. 4A is a perspective view of a method step for forming the microbridge structure of FIG. 3, according to the present invention.
Figure 4B:
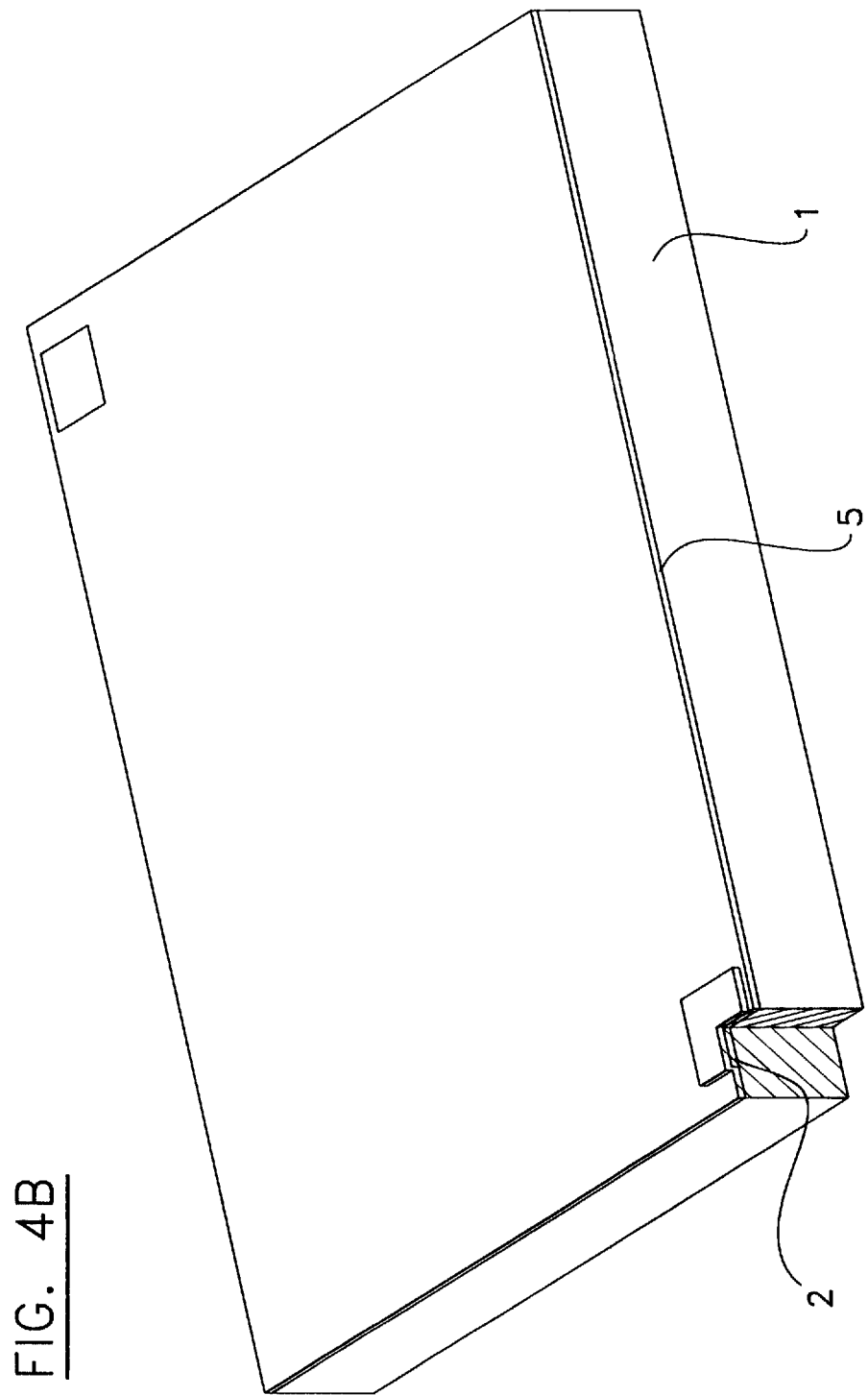
FIG. 4B is a perspective view of a method step for forming the microbridge structure of FIG. 3, according to the present invention.
Figure 4C:
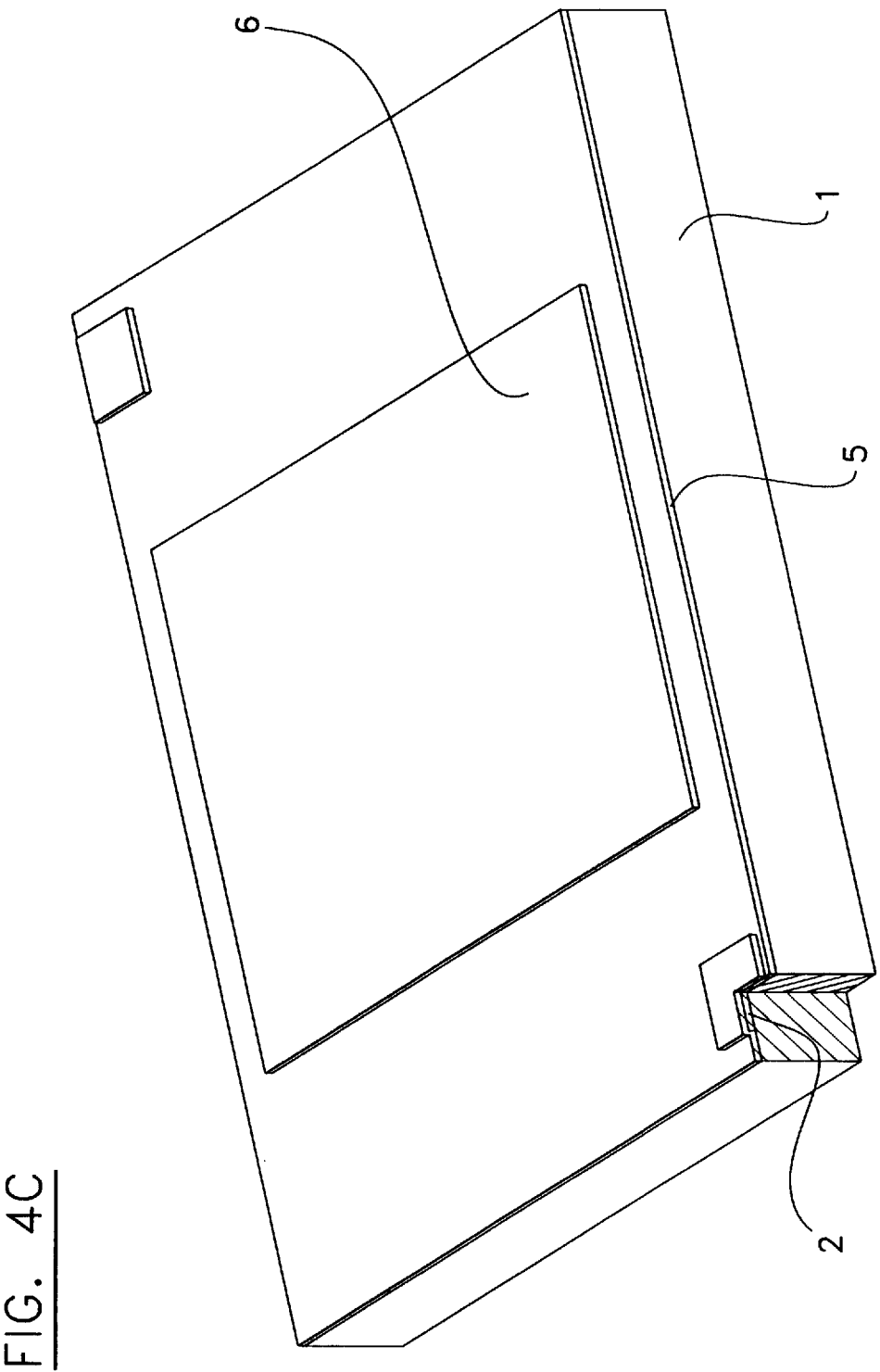
FIG. 4C is a perspective view of a method step for forming the microbridge structure of FIG. 3, according to the present invention.
Figure 4D:
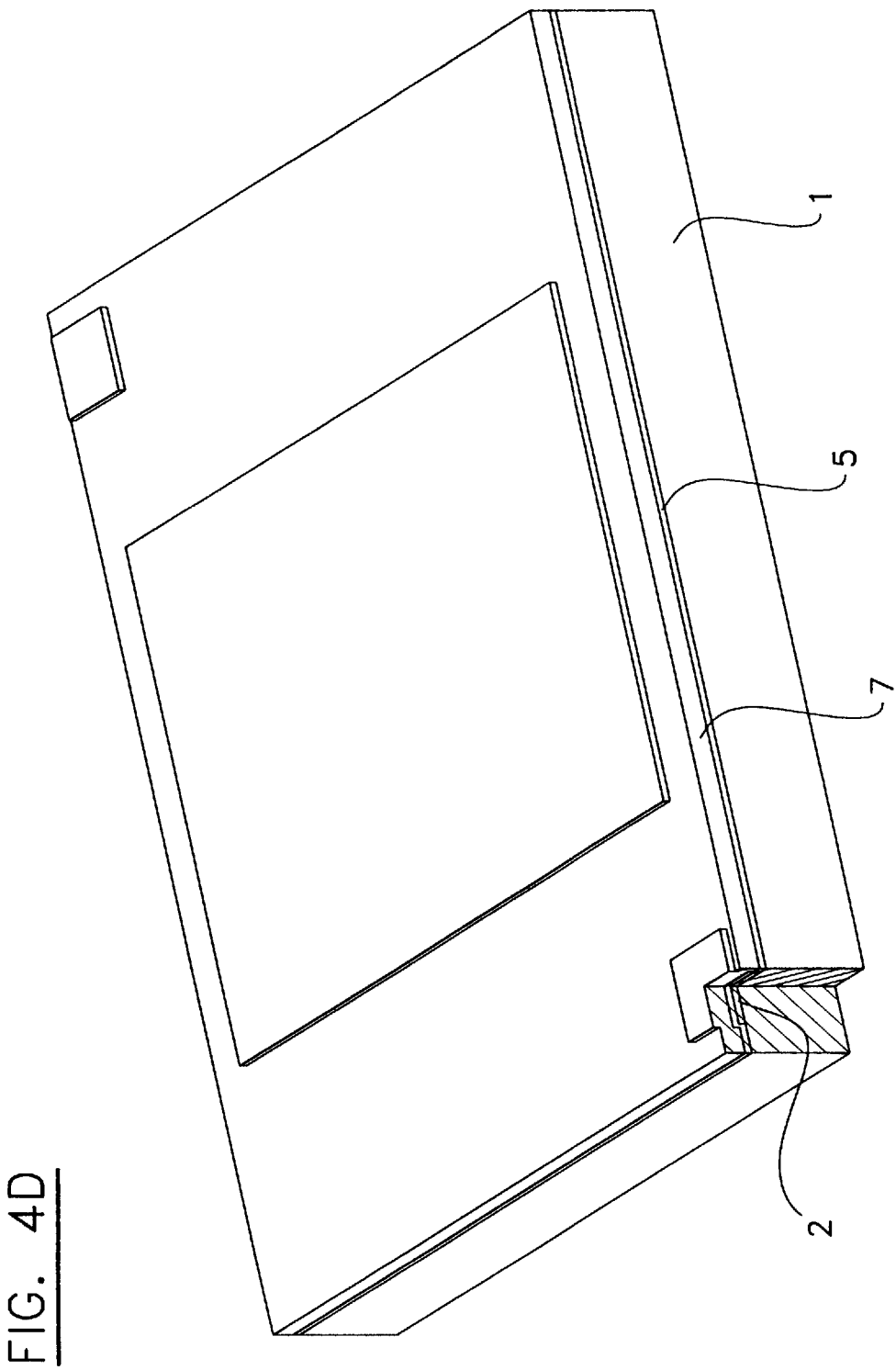
FIG. 4D is a perspective view of a method step for forming the microbridge structure of FIG. 3, according to the present invention.
Figure 4E:
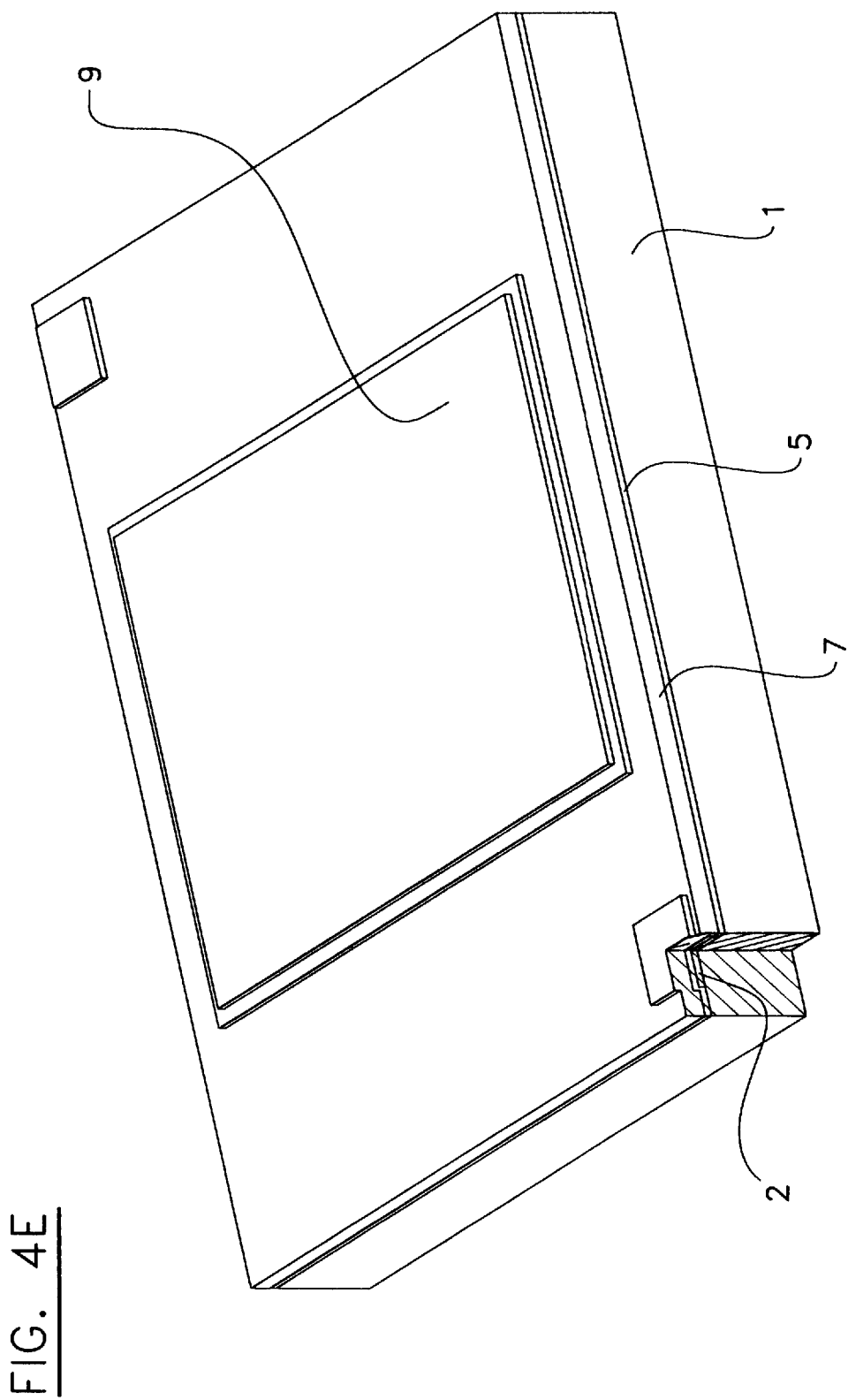
FIG. 4E is a perspective view of a method step for forming the microbridge structure of FIG. 3, according to the present invention.

Preferably, the radiation active layer 9 shown in FIG. 4E is responsive to temperature changes caused by absorbed infrared radiations and it is then made of a material exhibiting a substantially high temperature coefficient of resistivity. It has a thickness of substantially 0.1 to 0.5 $\mu$m, and a surface dimension of about 50 $\mu$m by 50 $\mu$m. The material exhibiting a substantially high temperature coefficient of resistivity is preferably selected from the group consisting of $VO_2$, $V_2O_3$ and a-Si, whereby the microbridge structure forms an uncooled infrared bolometric detector.

Preferably also, the radiation active layer 9 shown on FIG. 4E may be for generating heat for emitting infrared radiations. It is then made of a material selected from the group consisting of polysilicon, graphite, titanium oxides, tantalum oxides, silicon oxides, cermets, nichrome and TiN.

The microstructure 22 also comprises a radiation reflective layer 6, shown on FIG. 4C, lying between the underside 13 and the radiation active layer 9 shown on FIG. 4E. The radiation reflective layer 6 is preferably made of a material selected from the group consisting of Au, Al, Pt and TiN and it has a thickness of substantially a fraction of 1 $\mu$m.

In this embodiment, the microbridge structure also comprises a micro support 24, in a form of at least one, but typically two or four arms 14 and 15, for suspending the microstructure 22 over a cavity 21 anisotropically etched in the substrate layer 1 which is a silicon wafer. The underside 13 of the microstructure 22 faces the substrate layer 1. The micro support 24 is provided with at least two electrically conductive paths for connecting respectively the two first electrical contacts 2 to the two second electrical contacts 16 shown on FIG. 4F.

Preferably, the microstructure 22 further comprises upper and lower dielectric layers 11 and 7. The upper dielectric layer 11 lies over the radiation active layer 9 shown on FIG. 4E, and the lower dielectric layer 7 lies between the radiation active layer 9 shown on FIG. 4E and the radiation reflective layer 6 shown on FIG. 4C.

Also preferably, the microstructure 22 further comprises an underside dielectric layer 5. The underside dielectric layer 5 lies between the underside 13 of the microstructure 22 and the radiation reflective layer 6 shown on FIG. 4C, whereby the radiation reflective layer 6 is embedded between the lower dielectric layer 7 and the underside dielectric layer 5.

Preferably, the dielectric layers 5, 7 and 11 are made of a material selected from the group consisting of $Si_3N_4$ and $SiO_2$. Each of the dielectric layers 5, 7 and 11 has a thickness of substantially 0.1 to a few $\mu$ms.

Figure 4F:
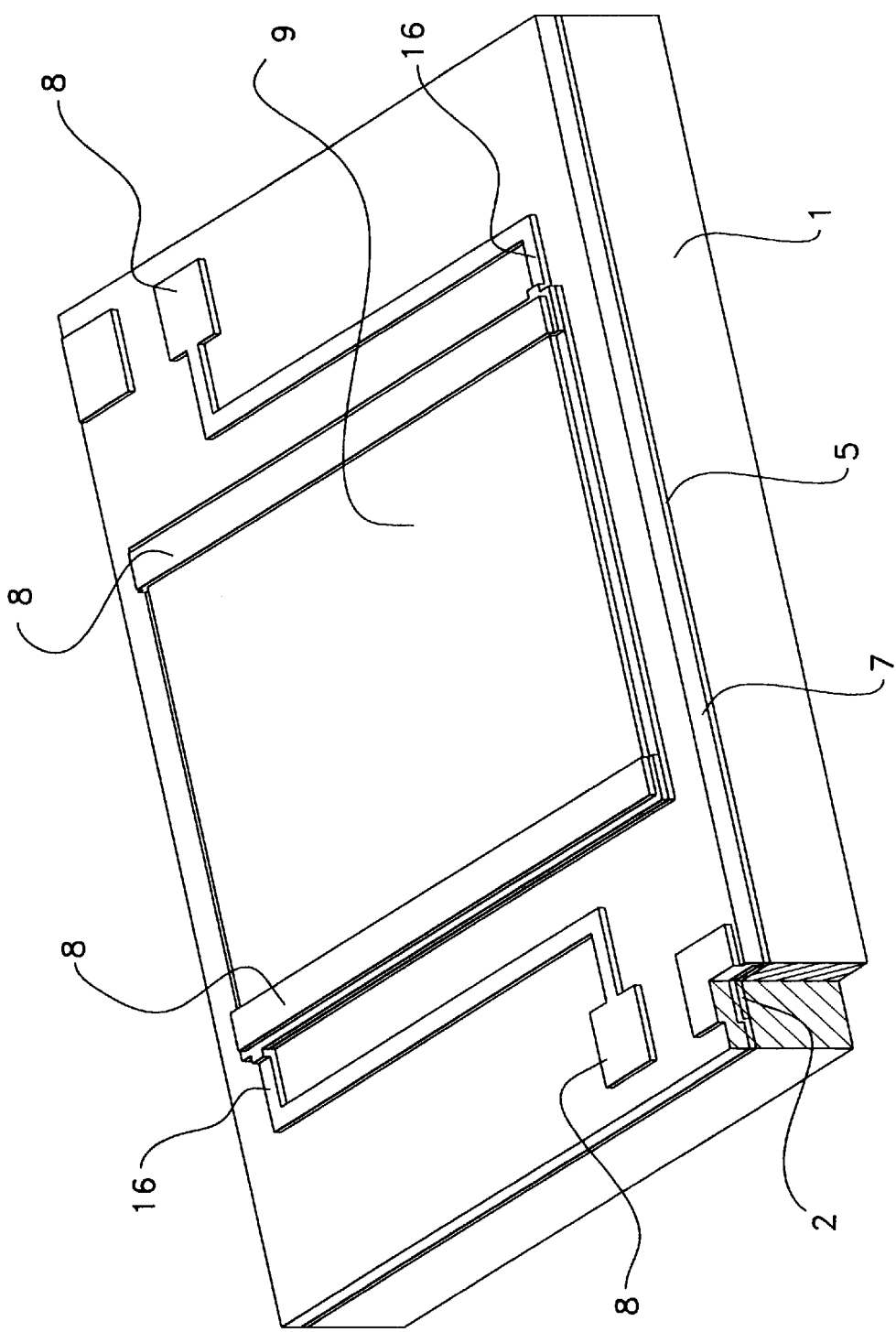
FIG. 4F is a perspective view of a method step for forming the microbridge structure of FIG. 3, according to the present invention.

Preferably, the micro support 24 has two arms 14 and 15. Each of the arms 14 and 15 has an end connected to the substrate layer 1 and an end connected to the microstructure 22 for supporting it with respect to the cavity 21 etched in the substrate layer 1. Each of the arms 14 and 15 is a multilayer arm comprising a layer 8 of electrically conductive material shown of FIG. 4F. Electrically conductive layers 10 shown in FIG. 4H are provided for connecting respectively the layers 8 of the arms shown in FIG. 4G to the electrical contacts 2 of the substrate layer 1. As the layers 8 of the arms are in contact with the electrical contacts 16 of the microstructure as shown in FIG. 4F, connections are made between contacts 2 and contacts 16. The third layer 11 of dielectric material covers the layers 10 and 8 of electrically conductive material.

The supporting arms 14 and 15 comprise typically the underside dielectric layer 5, the layer 8 of electrically conductive material, the lower dielectric layer 7 and the upper dielectric layer 11. The arms 14 and 15 provide a mechanical support to the microstructure 22 and a thermal contact between the microstructure 22 and the substrate layer 1 functioning as a heat sink. Moreover, they provide an electrical contact between the radiation active layer and readout electronics integrated in the substrate layer. The readout electronics are typically integrated in the substrate layer by means of a standard integrated circuit process. They are usually located in a position adjacent to the microstructure. Number, dimensions and shape of the arms are selected to provide a required thermal isolation of the suspended microstructure without sacrificing the compactness of the overall layout of the microstructure.

Preferably, the layers 8 and 10 are made of a material selected from the group consisting of Au, Ti, W, Al and V, and each has a typical thickness of less than 1 $\mu$m.

Referring now to FIGS. 4A to 4K, there are shown the steps of a method for forming the microbridge structure shown in FIG. 3. The microstructure is for emitting or detecting radiations.

The method comprises steps of (a) providing a substrate layer 1 provided with electrical contacts 2 as shown on FIG. 4A, and (b) covering the substrate layer 1 with a first dielectric layer 5 as shown on FIG. 4B. The first dielectric layer 5 is deposited on the surface of the substrate layer 1 which is a silicon wafer by means of a PECVD technique. This is the first dielectric layer used for the construction of the microstructure 22 and its supporting arms 14 and 15 shown in FIG. 3.

Then, there is a step of (c) covering the layers of previous steps (a) and (b) with a radiation reflective layer 6, and (d) patterning and etching the radiation reflective layer 6 as shown on FIG. 4C. The radiation reflective layer 6 is a reflecting metal layer deposited by means of a PVD technique, and then patterned by means of a lift-off technique or the combination of a standard photolithographic process and a dry or wet etching process.

Then, there is a step of (e) covering the layers of previous steps (a) to (d) with a second dielectric layer 7 to embed the radiation reflective layer within the first and second dielectric layers 5 and 7 as shown on FIG. 4D. The second dielectric layer 7 is deposited by means of a the PECVD technique.

Then, there are steps of (f) covering the layers of previous steps (a) to (e) with a radiation active layer 9, and (g) patterning and etching the radiation active layer 9 to define an active area for emitting or detecting radiations as shown on FIG. 4E. The layer 7 provides electrical isolation of the radiation reflective layer 6 shown in FIG. 4C from the radiation active layer 9. The radiation active layer 9 is preferably a $VO_2$ layer deposited by means of a reactive sputtering technique, and then reticulated to define a bolometer thermistor using the combination of a standard photolithographic process and a RIE process. In this embodiment, the bolometer thermistor is made of $VO_2$ but any other material with an appropriate TCR such as $V_2O_3$ or a-silicon, can be used.

Then, there are steps of (h) covering the layers of previous steps (a) to (g) with a first electrically conductive layer 8, and (i) patterning and etching it so that it provides two electrical paths from two distal points of the radiation active layer 9 as shown on FIG. 4F. The conductive layer 8 forms bolometer metal electrodes for connecting the radiation active layer 9 to the readout electronics of the substrate layer. The bolometer metal electrodes are fabricated by means of a lift-off process or by means of a dry or wet patterning of the conductive layer 8 which is deposited by a PVD technique. It should be appreciated that the order of steps (f) and (g) can be reversed with the order of steps (h) and (i).

Figure 4G:
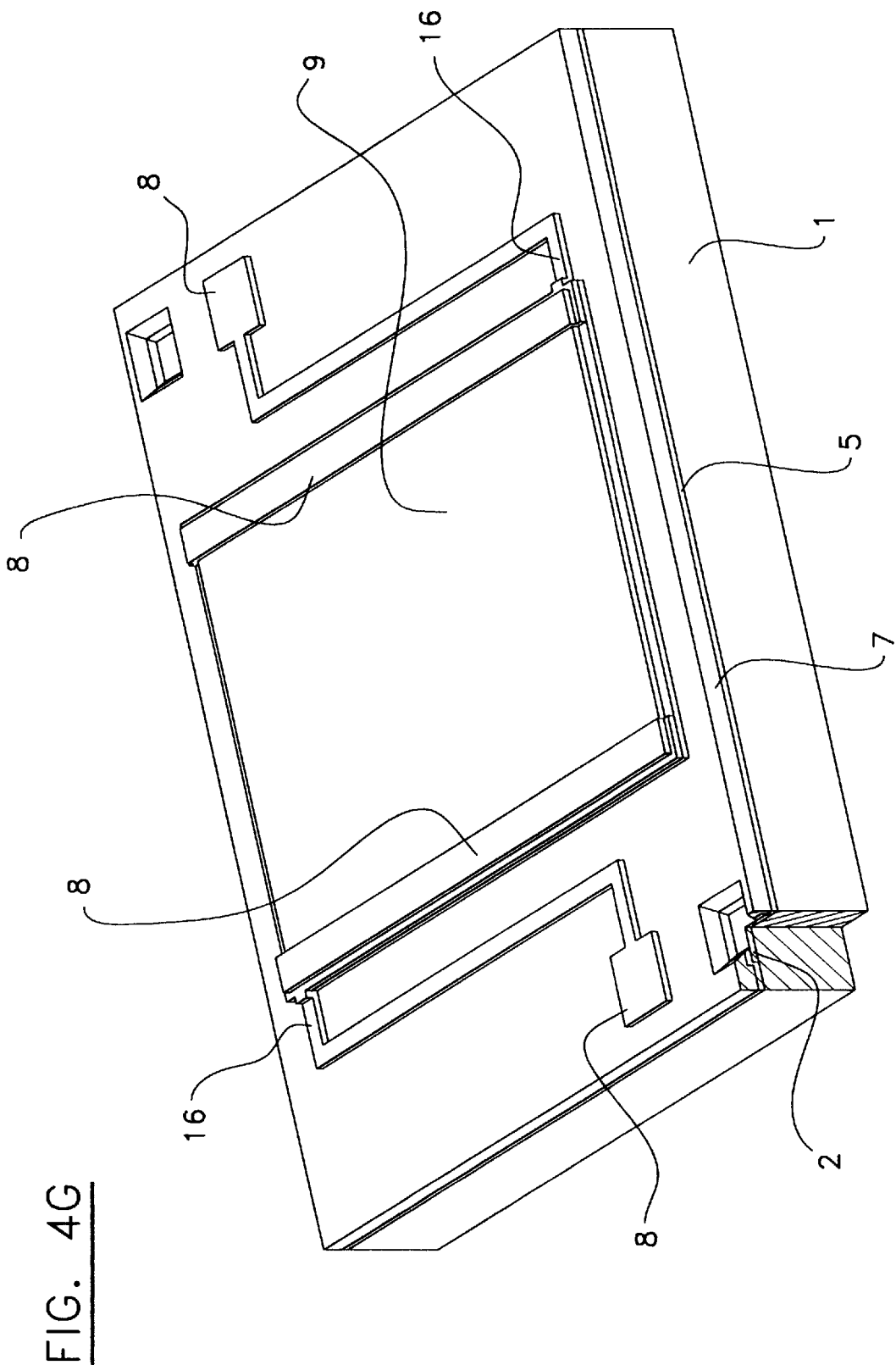
FIG. 4G is a perspective view of a method step for forming the microbridge structure of FIG. 3, according to the present invention.
Figure 4H:
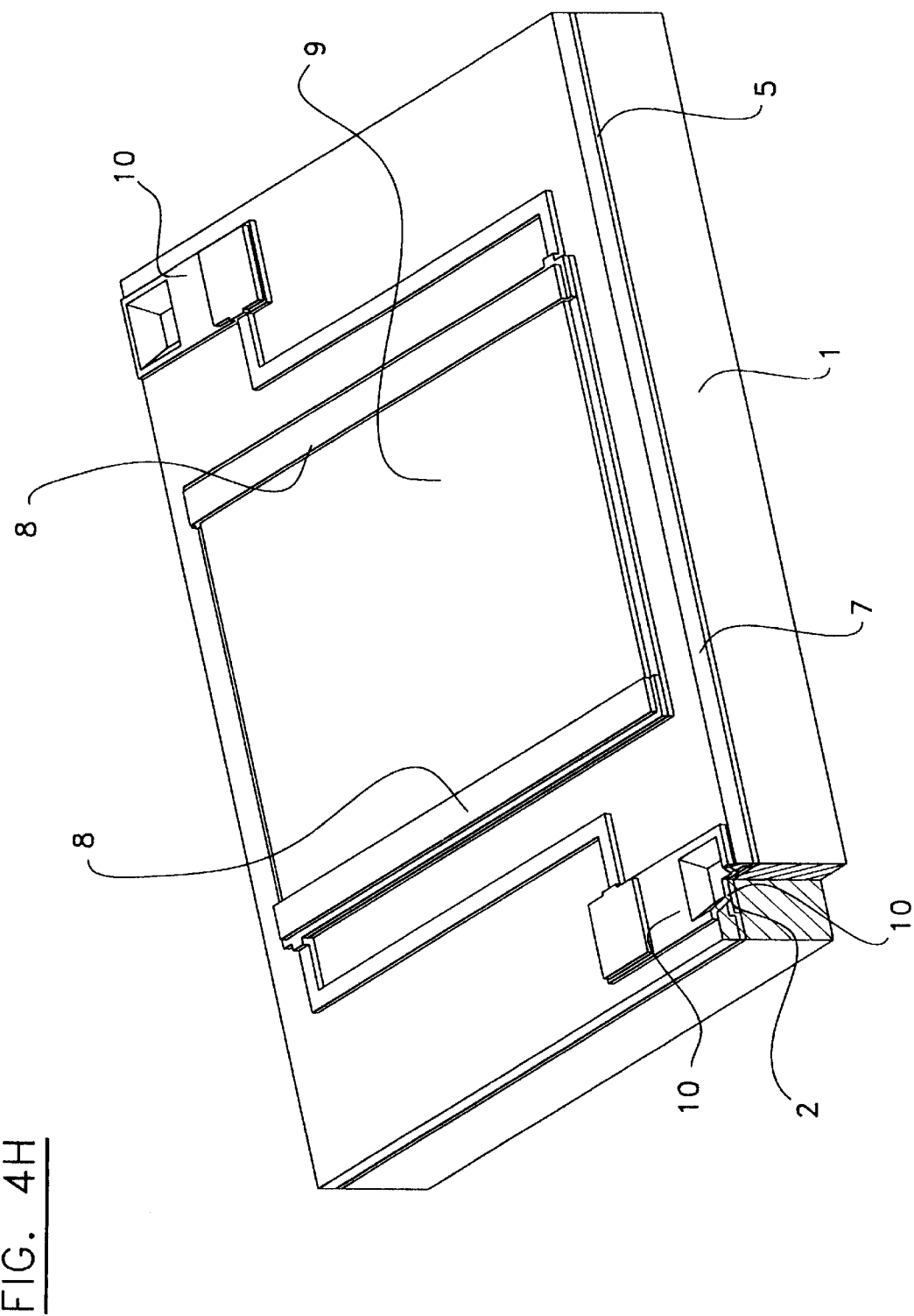
FIG. 4H is a perspective view of a method step for forming the microbridge structure of FIG. 3, according to the present invention.

The method also comprises steps of (j) patterning and etching of the first and the second dielectric layers 5 and 7 down to the electrical contacts 2 of the substrate layer 1 as shown on FIG. 4G, (k) covering the layers of previous steps (a) to (j) with a second electrically conductive layer 10, and patterning and etching it so that it provides electrical paths from the electrical contacts 2 of the substrate layer 1 to the radiation active layer 9 through the two electrical paths provided in the step (i) as shown on FIG. 4H. Step (h) further comprises a steps of covering the layers of previous steps (a) to (g) with a second electrically conductive layer 10, and patterning and etching it so that it provides two electrical paths from electrical contacts 2 of the substrate layer 1 as shown on FIG. 4H.

Figure 4I:
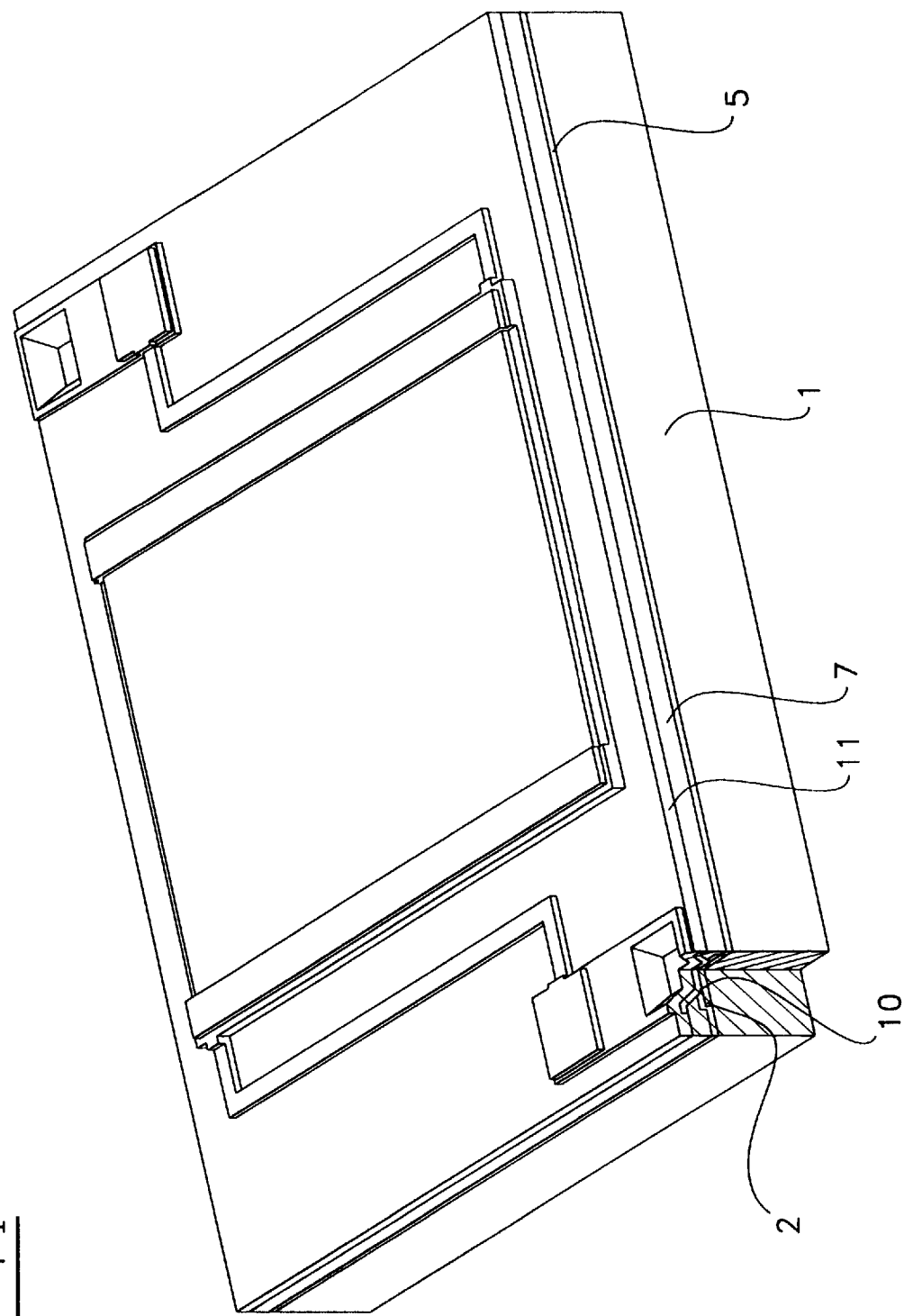
FIG. 4I is a perspective view of a method step for forming the microbridge structure of FIG. 3, according to the present invention.

Preferably, the step (k) further comprises, after the patterning and etching the second electrically conductive layer 10, a step of covering the layers of steps (a) to (k) with a third dielectric layer 11 to cover the first and second electrically conductive layers 8 and 10 and the radiation active layer 9 shown on FIG. 4H, as shown on FIG. 4I. The third dielectric layer 11 is deposited by means of a PECVD technique.

Figure 4J:
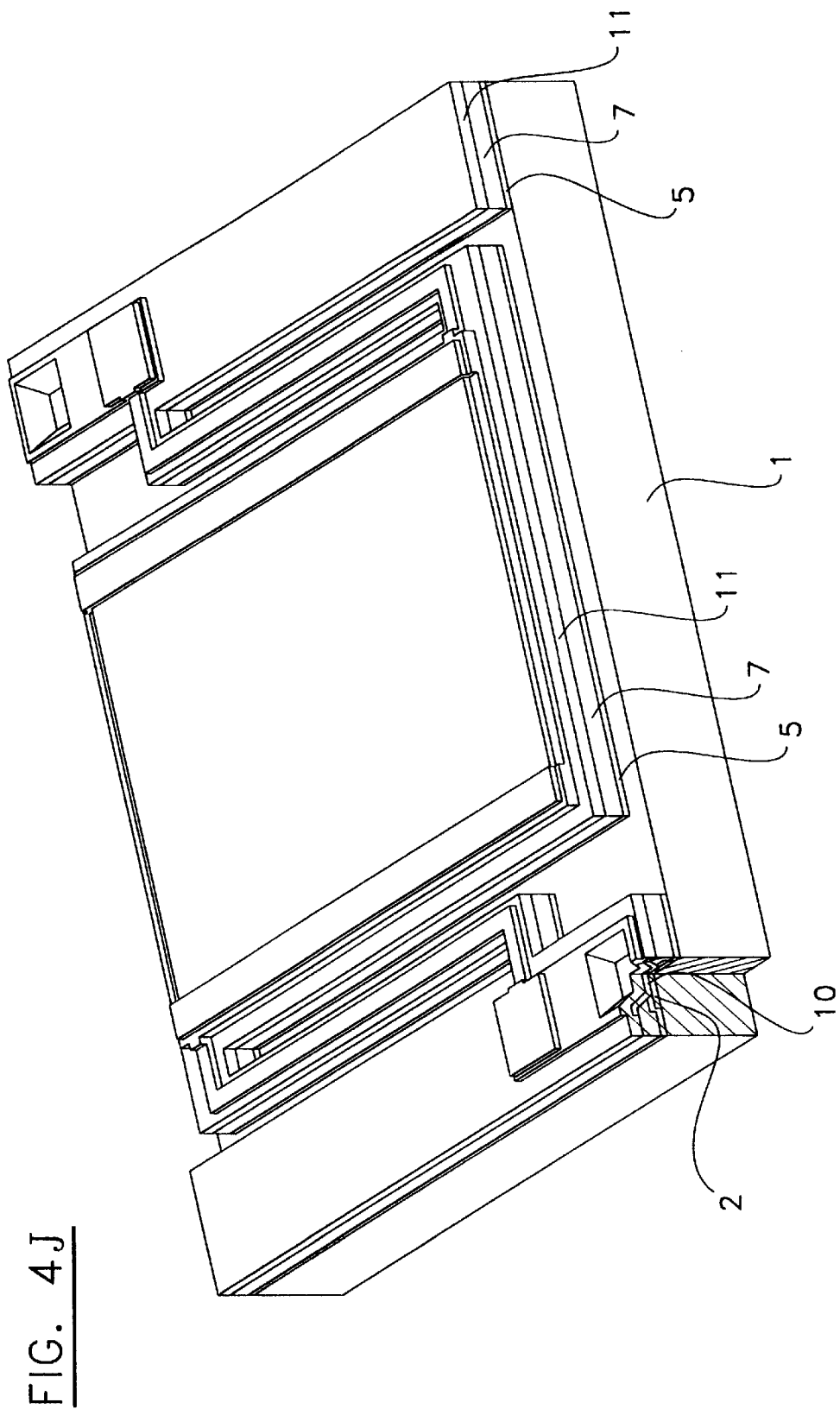
FIG. 4J is a perspective view of a method step for forming the microbridge structure of FIG. 3, according to the present invention.

Then, there a step of (l) patterning and etching the first, second and third dielectric layers 5, 7 and 11 down to the substrate layer 1, as shown on FIG. 4J. The three dielectric layers 5, 7 and 11 are reticulated down to the substrate layer 1 by means of the combination of a standard photolithographic process and a RIE process. This allows to define the geometrical form of the microstructure and its supporting arms. Moreover, this step (l) provides access to the substrate layer for a selective anisotropic etching thereof.

Figure 4K:
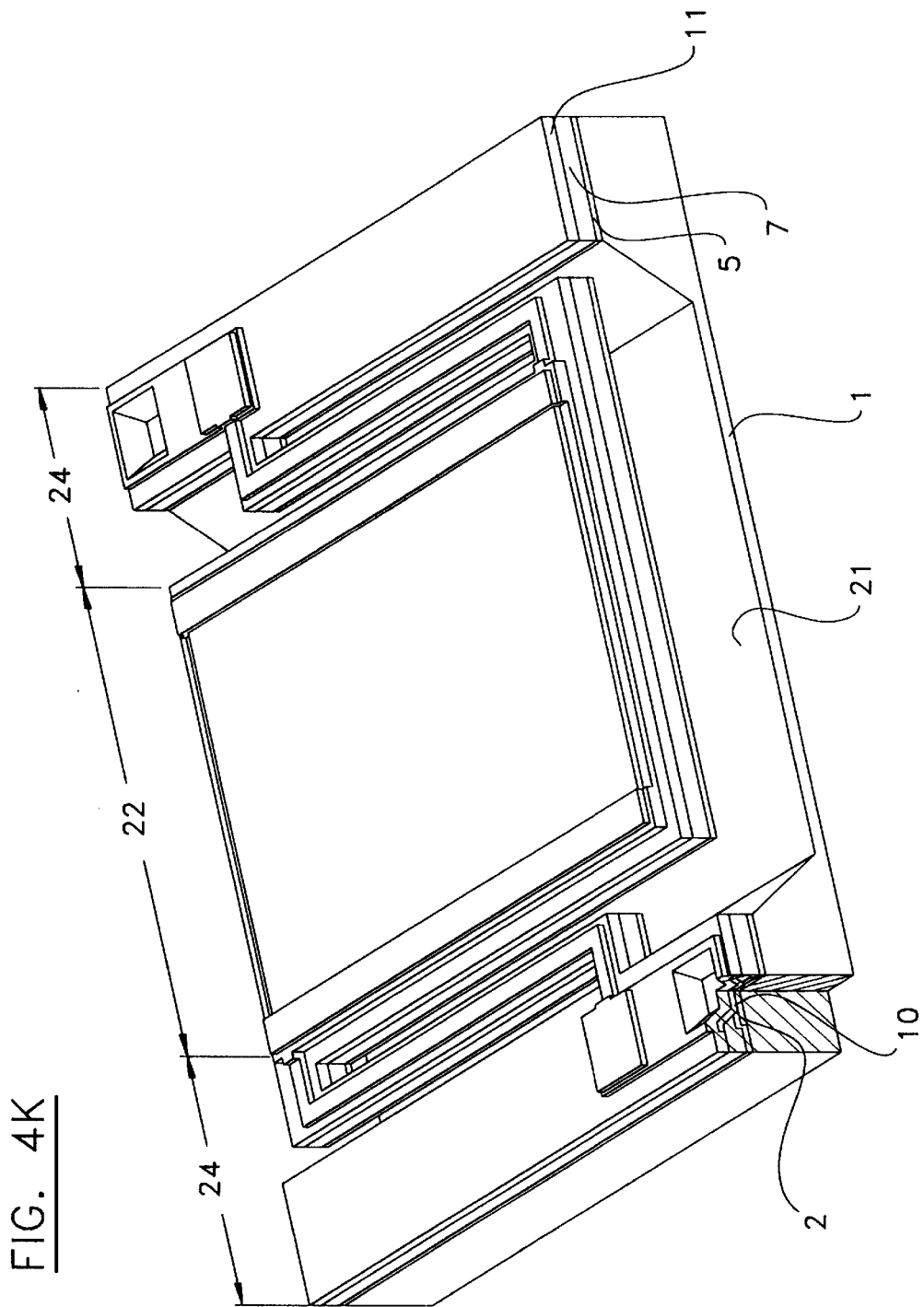
FIG. 4K is a perspective view of a method step for forming the microbridge structure of FIG. 3, according to the present invention.

Finally, there is a step of (m) etching the substrate layer 1 to reveal the microstructure 22 which is suspended by means of the micro support 24, as shown on FIG. 4K. The etching of the substrate layer 1 is a selective anisotropic etching performed by means of a water solution of KOH or other anisotropic wet etchants for silicon such as hydrazine-water solution, EDP (ethylenediamine-pyrocatechol-water), TMAH (tetramethylammonium hydroxide), and CsOH. This allows to form a cavity 21 in the silicon material of the substrate layer 1, directly beneath the microstructure 22 and its support 24. The microstructure 22 and its support 24 become suspended and as a result thermal isolation of the bolometric detector of the microstructure 22 is provided.

A microbridge structure according to the present invention enhances infrared radiation absorption in the bolometric detector. This design employs a radiation reflective layer which is a micro mirror embedded within the microstructure which forms a bolometer sandwich. This mirror, herein referred to as an integrated mirror, is similar in function to a mirror mounted on the substrate layer in that it reflects any radiation transmitted through the bulk of the bolometer back through said bolometer, thus improving the infrared radiation absorption.

Although the given description is basically in terms of an individual micro mirror integrated within an individual micro bolometer detector, the invention equally applies to multiple or segmented micro mirrors integrated within individual microbolometer detectors which are part of uni- or bi-dimensional arrays.

In addition, the integrated mirror approach offers two important advantages over the competing technology where the mirror is mounted on the substrate layer.

First, it is applicable to both bulk and surface micromachined bolometers. Since the mirror is an integral component of the bolometer sandwich, there are no restrictions on the material geometry beneath the device. Furthermore, in the case of surface micromachined bolometers, absorption is not a function of distance between the substrate layer and the suspended microstructure, and this in turn means that the airgap thickness between the substrate layer and the suspended microstructure can be chosen entirely based on manufacturing process requirements or other considerations. It follows that the absorption of a bolometer according to the present invention is insensitive to fabrication process variations in the gap thickness which can potentially reduce the degree of substrate planarization required. Second, in the case of surface micromachined bolometers, since there is no mirror on the substrate layer, vias by which the bolometer is connected to the underlying readout circuitry can be placed anywhere within the detector cell. This offers more flexibility in the readout circuit layout and the bolometer design.

Referring now to FIG. 5, in order to illustrate properties of the microbridge structure according to the present invention, the infrared radiation absorption in a bolometer structure equipped with the integrated mirror 34 are compared with the absorptive properties of two other structures such as a structure without any mirrors and any absorbers 32, and a structure equipped with the substrate mirror 30.

Thickness and materials of the various layers which form the discussed bolometer structures are as follows. In the case of a structure without mirror, the first layer of the microstructure is made of $Si_3N_4$ and has a thickness of 0.6 $\mu$m, the second layer is made of $VO_2$ and has a thickness of 0.3 $\mu$m and the third layer is made of $Si_3N_4$ and has a thickness of 0.6 $\mu$m. In the case of a structure with a mirror mounted on the substrate layer, the mirror is made of Au and has a thickness of 0.09 $\mu$m, the air gap has a thickness of 2.5 $\mu$m, the first layer of the microstructure is made of $Si_3N_4$ and has a thickness of 0.6 $\mu$m, the second layer is made of $VO_2$ and has a thickness of 0.3 $\mu$m and the third layer is made of $Si_3N_4$ and has a thickness of 0.6 $\mu$m.

In the case of a structure with a mirror integrated in the microstructure, the first layer of the microstructure is made of $Si_3N_4$ and has a thickness of 0.1 $\mu$m, the second layer is the mirror, it is made of Au and has a thickness of 0.09 $\mu$m, the third layer of the microstructure is made of $Si_3N_4$ and has a thickness of 1.0 $\mu$m, the fourth layer is made of $VO_2$ and has a thickness of 0.3 $\mu$m and the fifth layer is made of $Si_3N_4$ and has a thickness of 0.1 $\mu$m. Both layer materials and layer thickness are typical for certain bolometer structures.

Radiation absorption, i.e. absorbance, in the wavelength range from 8 to 12 $\mu$m, in the described structures is shown in FIG. 5. The bolometer structure not equipped with a mirror exhibits the lowest overall and peak absorbance for a given wavelength. The bolometer structure equipped with the integrated mirror exhibits higher overall and peak absorbance in comparison with the structure without a mirror. The bolometer structure equipped with the substrate mirror exhibits the highest peak absorbance due to the optical resonance effect in the air gap cavity. At some other wavelengths outside the resonance wavelength range, the absorbance approaches values similar to the absorbance values for the bolometer structure not equipped with a mirror, i.e. the values are lower than the absorbance values for the bolometer structure equipped with the integrated mirror.

For the bolometric detectors operating in the 8 to 12 $\mu$m wavelength range, the peak absorption at a particular wavelength may be less important than the blackbody absorption over a selected band. The 300 K blackbody absorbance $\alpha$ in the 8 to 12 $\mu$m wavelength range at zero degrees angle of incidence can be expressed as:

$$\alpha(8-12\,\mu m, 300K) = \frac{1}{\int_8^{12} E_{\lambda,T}(\lambda,T)} \int_8^{12} \eta(\lambda) E_{\lambda,b}(\lambda,T) \partial\lambda$$

where $\eta(\lambda)$ is the absorption as a function of wavelength, and $E_{\lambda,b}(\lambda,T)$ is the spectral emissive power (Planck) distribution of radiation emitted by a blackbody at a temperature T Kelvin. $E_{\lambda,b}(\lambda,T)$ is expressed as:

$$E_{\lambda,b}(\lambda,T) = \frac{C_1}{\lambda^5 x(e^{c_2/\lambda T} - 1)}$$

where $C_1 = 3.742 \times 10^8$ W $\mu m^4/m^2$ and $C_2 = 1.439 \times 10^4$ $\mu m$ K.

The values of $\alpha$ for the considered bolometer structures are $\alpha = 0.260$ for the bolometer without a mirror, $\alpha = 0.361$ for the bolometer equipped with the substrate mirror, and $\alpha = 0.425$ for the bolometer equipped with the integrated mirror. The bolometer equipped with the integrated mirror exhibits the highest overall infrared radiation energy absorption in the 8 to 12 $\mu$m wavelength range. This may potentially lead to the highest overall sensitivity of the bolometric detector equipped with the integrated mirror.

The integrated micro mirror structure described in this application may be further optimized. Further, the arrangement of the films in the bolometer sandwich may well be revised in order to simplify the fabrication procedure or to improve performance. Furthermore, while this invention has been described with reference to the preferred embodiments, i.e. bulk or surface micromachined uncooled infrared bolometric detectors, this description is not intended to be construed to a limiting sense. Various modifications or combinations of the illustrative embodiments, as well as other embodiments such as for example miniature thermal radiation emitters, will be apparent to persons skilled in the art upon reference to the description. It is therefore intended that the described invention encompasses any such modifications or embodiments.

What is claimed is:

1. A microbridge structure for emitting or detecting radiations, comprising:

a substrate layer provided with two first electrical contacts;

a microstructure provided with two second electrical contacts and having:
   an underside,
   a top side opposite to the underside, through which radiations are emitted or received,
   at least one radiation active layer lying between the underside and the top side, the radiation active layer having two distal points connected respectively to the two second electrical contacts of the microstructure, and
   a radiation reflective layer lying between the underside and the radiation active layer; and a micro support for suspending the microstructure over and at a predetermined distance from the substrate layer with the underside of the microstructure facing the substrate layer, the micro support being provided with at least two electrically conductive paths for connecting respectively the two first electrical contacts to the two second electrical contacts.

2. A microbridge structure according to claim 1, wherein the radiation active layer is responsive to temperature changes caused by absorbed infrared radiations.

3. A microbridge structure according to claim 1, wherein:
   the microstructure further comprises upper and lower dielectric layers, the upper dielectric layer lying over the radiation active layer, and the lower dielectric layer lying between the radiation active layer and the radiation reflective layer; and
   the microstructure further comprises an underside dielectric layer, the underside dielectric layer lying between the underside of the microstructure and the radiation reflective layer, whereby the radiation reflective layer is embedded between the lower dielectric layer and the underside dielectric layer.

4. A microbridge structure according to claim 1, wherein the reflective layer is made of a material selected from the group consisting of Au, Al, Pt and TiN.

5. A microbridge structure according to claim 3, wherein:
the radiation active layer is made of a material exhibiting a substantially high temperature coefficient of resistivity;
the radiation active layer has a thickness of substantially 0.1 to 0.5 $\mu$m, and a surface dimension of about 50 $\mu$m by 50 $\mu$m;
the dielectric layers are made of a material selected from the group consisting of $Si_3N_4$ and $SiO_2$; and
the dielectric layers each has a thickness of substantially 0.1 to a few $\mu$ms.

6. A microbridge structure according to claim 5, wherein the material exhibiting a substantially high temperature coefficient of resistivity is selected from the group consisting of $VO_2$, $V_2O_3$ and a-Si, whereby the microbridge structure forms an uncooled infrared bolometric detector.

7. A microbridge structure according to claim 1, wherein the micro support has two legs each extending along a vertical axis, each of the legs having a central upper cavity extending along the vertical axis within the leg, each of the legs having a lower end connected to the substrate layer and an upper end connected to the microstructure for supporting the microstructure with respect to the substrate layer, each of the legs is a multilayer leg comprising first and second layers of electrically conductive material, the first layer of each of the legs extending from the upper end to the lower end thereof and connecting one of the two second electrical contacts of the microstructure to one of the two first electrical contacts of the substrate layer via the second layer.

8. A microbridge structure according to claim 7, wherein each of the legs also comprises a third layer of dielectric material which covers the first and second layer.

9. A microbridge structure according to claim 7, wherein the first and second layers are made of a material selected from the group consisting of Au, Ti, W, Al and V.

10. A microbridge structure according to claim 7, wherein the first and second layers each has a typical thickness of less than 1 $\mu$m.

11. A microbridge structure according to claim 7, wherein each of the legs has substantially the shape of an upside down hollow truncated pyramid.

12. A microbridge structure according to claim 7, wherein each of the legs has an upper portion made of upper parts of the layers and shaped as a collar with a width of substantially 1 to 2 $\mu$ms.

13. A microbridge structure according to claim 1, wherein the radiation reflective layer has a thickness of substantially a fraction of 1 $\mu$m.

14. A microbridge structure according to claim 1, wherein the radiation active layer is for emitting infrared radiations.

15. A microbridge structure according to claim 14, wherein the radiation active layer is made of a material selected from the group consisting of polysilicon, graphite, titanium oxides, tantalum oxides, silicon oxides, cermets, nichrome and TiN.

16. A microbridge structure according to claim 1, wherein:
the substrate layer is provided with a hollow area above which the microstructure is suspended; and
the micro support has two arms for supporting the microstructure over the hollow area, each of the arms having a first end connected to the substrate layer and a second end connected to the microstructure, each of the arms comprising a first layer of electrically conductive material and a second layer of dielectric material, the layers of each arm extending along the length thereof, the first layers providing two electrical paths from the two distal points of the radiation active layer to the two first electrical contacts of the substrate layer.

17. A microbridge structure according to claim 16, wherein each of the arms also comprises a third layer of dielectric material which, in combination with the second layer, embeds the first layer except for extremities thereof where openings are provided for one of the two electrical paths to one of the two distal points of the radiation active layer and to one of the electrical contacts of the substrate layer.

18. A method for forming a microbridge structure comprising a microstructure and a micro support for suspending the microstructure, the microstructure being for emitting or detecting radiations, the method comprising the steps of:
(a) providing a substrate layer with electrical contacts;
(b) covering the substrate layer with a temporary layer, and patterning and etching cavities in the temporary layer to provide accesses to the electrical contacts of the substrate layer, the cavities being also for containing legs of the micro support, each of the cavities extending along a vertical axis, each of the cavities having a lower end opened out onto the electrical contacts of the substrate layer;
(c) covering the layers of previous steps (a) and (b) with a radiation reflective layer;
(d) patterning and etching the radiation reflective layer;
(e) covering the layers of previous steps (a) to (d) with a first dielectric layer;
(f) patterning and etching the first dielectric layer to provide accesses to the electrical contacts of the substrate layer;
(g) covering the layers of previous steps (a) to (f) with a first electrically conductive layer;
(h) patterning and etching the electrically conductive layer so that the electrically conductive layer forms a part of the micro support and provides an electrical path to the electrical contacts of the substrate layer;
(i) covering the layers of previous steps (a) to (h) with a radiation active layer;
(j) patterning and etching the radiation active layer to define an active area for emitting or detecting radiations;
(k) covering the layers of previous steps (a) to (j) with a second electrically conductive layer, and patterning and etching the second electrically conductive layer so that said second electrically conductive layer provides two electrical paths from two distal points of the radiation active layer to the electrical contacts of the substrate layer through the first electrically conductive layer;
(l) patterning and etching the first dielectric layer down to the temporary layer;
(m) removing the temporary layer to reveal the microstructure which comprises a radiation reflective layer and the radiation active layer, and which is suspended by means of the micro support.

19. A method according to claim 18, wherein:
the step (b) further comprises, after the patterning and etching of the temporary layer, a step of covering the layers of steps (a) and (b) with a second dielectric layer;

the step (f) further comprises a step of patterning and etching also the second dielectric layer to provide accesses to the electrical contacts of the substrate layer, and to embed, in combination with the first dielectric layer, the radiation reflective layer;

the step (k) further comprises, after the patterning and etching of the second electrically conductive layer, a step of covering the layers of the steps (a) to (k) with a third dielectric layer to cover the second electrically conductive layer and the radiation active layer; and the step (l) further comprises a step of patterning and etching the second and third dielectric layers down to the temporary layer.

20. A method for forming a microbridge structure comprising a microstructure and a micro support for suspending the microstructure, the microstructure being for emitting or detecting radiations, the method comprising the steps of:

(a) providing a substrate layer provided with electrical contacts;

(b) covering the substrate layer with a first dielectric layer;

(c) covering the layers of previous steps (a) and (b) with a radiation reflective layer;

(d) patterning and etching the radiation reflective layer;

(e) covering the layers of previous steps (a) to (d) with a second dielectric layer to embed the radiation reflective layer within the first and second dielectric layers;

(f) covering the layers of previous steps (a) to (e) with a radiation active layer;

(g) patterning and etching the radiation active layer to define an active area for emitting or detecting radiations;

(h) covering the layers of previous steps (a) to (g) with a first electrically conductive layer;

(i) patterning and etching the first electrically conductive layer so that said first electrically conductive layer provides two electrical paths from two distal points of the radiation active layer;

(j) patterning and etching of the first and the second dielectric layers down to the electrical contacts of the substrate layer;

(k) covering the layers of previous steps (a) to (j) with a second electrically conductive layer, and patterning and etching the second electrically conductive layer so that said second electrically conductive layer provides electrical paths from the electrical contacts of the substrate layer to the radiation active layer through the two electrical paths provided in the step (i);

(l) patterning and etching the first and second dielectric layers down to the substrate layer; and (m) etching the substrate layer to reveal the microstructure which comprises the radiation active layer and the radiation reflective layer and which is suspended by means of the micro support.

21. A method according to claim 20, wherein:

the step (k) further comprises, after the patterning and etching the second electrically conductive layer, a step of covering the layers of steps (a) to (k) with a third dielectric layer to cover the first and second electrically conductive layers and the radiation active layer; and the step (l) further comprises a step of patterning and etching the third dielectric layer down to the substrate layer.

* * * * *